United States Patent
Krames et al.

(10) Patent No.: US 6,844,571 B2
(45) Date of Patent: Jan. 18, 2005

(54) III-NITRIDE LIGHT-EMITTING DEVICE WITH INCREASED LIGHT GENERATING CAPABILITY

(75) Inventors: Michael R Krames, Mt. View, CA (US); Daniel A. Steigerwald, Cupertino, CA (US); Fred A. Kish, Jr., San Jose, CA (US); Pradeep Rajkomar, San Jose, CA (US); Jonathan J. Wierer, Jr., San Jose, CA (US); Tun S Tan, Los Altos Hills, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/071,507

(22) Filed: Feb. 7, 2002

(65) Prior Publication Data

US 2002/0070386 A1 Jun. 13, 2002

Related U.S. Application Data

(62) Division of application No. 09/469,657, filed on Dec. 22, 1999, now Pat. No. 6,486,499.

(51) Int. Cl.[7] .......................... H01L 27/15; H01L 31/12; H01L 33/00
(52) U.S. Cl. ............................ 257/81; 257/12; 257/13; 257/37; 257/38; 257/39; 257/98
(58) Field of Search .............................. 257/12, 13, 37, 257/38, 39, 81, 98

(56) References Cited

U.S. PATENT DOCUMENTS

| | | |
|---|---|---|
| 3,593,070 A | 7/1971 | Reed |
| 3,813,587 A | 5/1974 | Umeda et al. |
| 3,947,840 A | 3/1976 | Craford et al. |
| 4,165,474 A | 8/1979 | Myers |
| 4,238,707 A | 12/1980 | Malissin et al. ............ 315/175 |
| 4,329,625 A | 5/1982 | Nishizawa et al. ......... 315/158 |
| 4,423,478 A | 12/1983 | Bullock et al. ............... 363/89 |

(List continued on next page.)

FOREIGN PATENT DOCUMENTS

| | | |
|---|---|---|
| DE | 19756856 A1 | 12/1997 |
| DE | 19 921 987 | 11/1999 |
| EP | 0 371 554 A1 | 6/1990 |
| EP | 0 550 963 A1 | 7/1993 |

(List continued on next page.)

OTHER PUBLICATIONS

"Barrier Layer in the metallisation of Semiconductor Diode Lasers" Research Disclosure, Kenneth Mason Publications, Hampshire, 1994, No. 360, p. 179, XP000446545, ISSN: 0374–4353.

Evans et al., "Edge–Emitting Quantum Well Heterostructure Laser Diodes with Auxiliary Native–Oxide Vertical Cavity Confinement," *Applied Physics Letters*, 67(1995) Nov. 20, No. 21, pp. 3168–3170.

(List continued on next page.)

*Primary Examiner*—Amir Zarabian
*Assistant Examiner*—Ida M. Soward
(74) *Attorney, Agent, or Firm*—Patent Law Group LLP

(57) ABSTRACT

The present invention is an inverted III-nitride light-emitting device (LED) with enhanced total light generating capability. A large area device has an n-electrode that interposes the p-electrode metallization to provide low series resistance. The p-electrode metallization is opaque, highly reflective, and provides excellent current spreading. The p-electrode at the peak emission wavelength of the LED active region absorbs less than 25% of incident light per pass. A submount may be used to provide electrical and thermal connection between the LED die and the package. The submount material may be Si to provide electronic functionality such as voltage-compliance limiting operation. The entire device, including the LED-submount interface, is designed for low thermal resistance to allow for high current density operation. Finally, the device may include a high-refractive-index (n>1.8) superstrate.

36 Claims, 23 Drawing Sheets

U.S. PATENT DOCUMENTS

| | | | | | |
|---|---|---|---|---|---|
| 4,445,965 | A | * | 5/1984 | Milnes | 438/95 |
| 4,536,607 | A | * | 8/1985 | Wiesmann | 136/249 |
| 4,616,403 | A | * | 10/1986 | Schulte et al. | 438/59 |
| 4,838,648 | A | * | 6/1989 | Phillips et al. | 359/585 |
| 4,983,884 | A | | 1/1991 | Wychulis | 315/151 |
| 5,124,779 | A | * | 6/1992 | Furukawa et al. | 257/77 |
| 5,247,203 | A | * | 9/1993 | Shigihara et al. | 257/713 |
| 5,362,977 | A | | 11/1994 | Hunt et al. | 257/98 |
| 5,408,120 | A | | 4/1995 | Manabe et al. | 257/431 |
| 5,410,159 | A | | 4/1995 | Sugawara et al. | 257/13 |
| 5,461,425 | A | | 10/1995 | Fowler et al. | 348/294 |
| 5,521,440 | A | * | 5/1996 | Iranmanesh | 257/774 |
| 5,557,115 | A | | 9/1996 | Shakuda | 257/81 |
| 5,563,422 | A | | 10/1996 | Nakamura et al. | 257/13 |
| 5,744,829 | A | | 4/1998 | Murasato et al. | 257/94 |
| 5,779,924 | A | * | 7/1998 | Krames et al. | 216/24 |
| 5,862,167 | A | | 1/1999 | Sassa et al. | 372/45 |
| 5,886,401 | A | | 3/1999 | Liu | 257/678 |
| 5,909,036 | A | * | 6/1999 | Tanaka et al. | 257/94 |
| 5,914,501 | A | | 6/1999 | Antle et al. | 257/99 |
| 5,963,787 | A | * | 10/1999 | Kimura et al. | 438/46 |
| 5,966,393 | A | * | 10/1999 | Hide et al. | 372/23 |
| 5,998,232 | A | | 12/1999 | Maruska | 438/46 |
| 6,016,038 | A | | 1/2000 | Mueller et al. | 315/291 |
| RE36,747 | E | | 6/2000 | Manabe et al. | 257/431 |
| 6,081,540 | A | | 6/2000 | Nakatsu | 372/45 |
| 6,091,085 | A | | 7/2000 | Lester | 257/98 |
| 6,121,127 | A | | 9/2000 | Shibata et al. | 438/604 |
| 6,133,589 | A | | 10/2000 | Krames et al. | 257/103 |
| 6,150,774 | A | | 11/2000 | Mueller et al. | 315/291 |
| 6,153,894 | A | * | 11/2000 | Udagawa | 257/96 |
| 6,169,294 | B1 | | 1/2001 | Biing-Jye et al. | 257/79 |
| 6,252,255 | B1 | * | 6/2001 | Ueta et al. | 257/94 |
| 6,333,522 | B1 | * | 12/2001 | Inoue et al. | 257/99 |
| 6,384,429 | B1 | | 5/2002 | Ogihara et al. | |
| 6,388,275 | B1 | * | 5/2002 | Kano | 257/94 |
| 2001/0000410 | A1 | * | 4/2001 | Krames et al. | 257/98 |
| 2002/0047131 | A1 | | 4/2002 | Ludowise et al. | |
| 2003/0025121 | A1 | * | 2/2003 | Edmond et al. | 257/99 |

FOREIGN PATENT DOCUMENTS

| | | |
|---|---|---|
| EP | 0702414 A2 | 3/1996 |
| EP | 0 772 249 A2 | 5/1997 |
| EP | 0 772 249 A3 | 11/1998 |
| EP | 0 921 577 A1 | 6/1999 |
| EP | 0 926 744 A2 | 6/1999 |
| EP | 0 926 744 A3 | 5/2000 |
| EP | 1 020 935 A2 | 7/2000 |
| EP | 1 030 377 A2 | 8/2000 |
| GB | 2301934 | 12/1996 |
| GB | 2 343 994 | 5/2000 |
| JP | 05291621 | 5/1993 |
| JP | 0 529 1621 | 11/1993 |
| JP | 7 235 624 | 9/1995 |
| JP | 11 150 297 | 6/1999 |
| JP | 11 191 641 | 7/1999 |
| JP | 11 274568 | 10/1999 |
| WO | WO 96/09653 | 3/1996 |

OTHER PUBLICATIONS

Han, H. et al.: "Electroplated Solder Joints for Optoelectronic Applications" Electonic Components & Technology, 1996, pp. 963–966, XP000646645.

M. R. Krames et al., "High–power truncated–inverted–pyramid $(Al_xGa_{1-x})_{0.5}In_{0.5}P/GaP$ light–emitting diodes exhibiting>50% external quantum efficiency," Applied Physics Letter, vol. 75, No. 16, Oct. 18, 1999.

Roger Maxwell, "LED or Lamp Flasher: Minimum parts counting Designed for 3V battery operation", http:/www.ee.washington.edu/circuit_archive/circuits.

Mensz, P.M. et al.: "$In_xGa_{1-x}N/Al_yGa_{1-y}N$ violet light emitting diodes with reflective p–contacts for high single sided light extraction" Electronics Letters, GB, IEE Stevenage, vol. 33, No. 24, Nov. 20, 1997, pp. 2066–2068, XP000734311, ISSN: 0013–5194.

G. J. Sun and K. H. Chae, "Properties of 2,3–butanedione and 1–phenyl–1,2–propanedione As New Photosensitizers For Visible Light Cured Dental Resin Composities", Polymer, vol. 41, pp. 6205–6212 (2000).

Tan, Q. et al.: "Soldering technology for Optoelectronic Packaging" Electronic Components & Technology, 1996, pp. 26–36, XP000646646.

Sugawara, H. et al, "Emission Properties of InGaAIP, Visible Light–Emitting Diodes Employing a Multiquatum–Well Active Layer", Jpn. J. Appl. Phys., vol. 33 (1994) Pt. 1, No. 10, Oct. 1994, pp. 5784–5787.

Chang, S. J., et al, "AlGaInP multiquantum well light–emitting diodes", IEE Proc.–Optoelectron, vol. 144, No. 6, Dec. 1997, pp. 405–409.

Benisty, H., "Impact of Planar Microcavity Effects on Light Extraction–Part I: Basic Concepts and Analytical Trends", IEE Journal of Quantum Electronics, vol. 34, No. 9, Sep. 1998, pp. 1612–1631.

P. Maaskkant et al., "Fabrication of GaN–based Resonant Cavity LEDs,"phys. stat.sol. (submitted Feb. 19, 2002), 14 pages.

* cited by examiner

LED CHIP

SUBMOUNT

III-NITRIDE LIGHT-EMITTING DEVICE WITH INCREASED LIGHT GENERATING CAPABILITY

CROSS REFERENCE TO RELATED APPLICATION

This application is a divisional of application Ser. No. 09/469,657, titled "III-Nitride Light-Emitting Device With Increased Light Generating Capability," filed Dec. 22, 1999 now U.S. Pat. No. 6,486,499, and incorporated herein by reference.

FIELD OF THE INVENTION

The present invention relates to semiconductor light emitting devices, and more particularly to III-nitride based light-emitting devices with improved light generating capability.

BACKGROUND OF THE INVENTION

A "III-nitride" material system is any combination of group III and group V elements, with nitrogen being the primary group V element, to form semiconductors used in the fabrication of electronic or optoelectronic devices. This material system includes, but is not limited to, GaN, AlGaN, AlN, GaInN, AlGaInN, InN, GaInAsN, and GaInPN. The III-nitride material system is suitable for the fabrication of light-emitting devices (LEDs) that generate light with photon energies from the ultra-violet to the red spectral wavelength regimes. These LEDs include light-emitting diodes and laser diodes.

A III-nitride LED typically includes epitaxial layers deposited upon a suitable growth substrate to form a p-n junction via growth techniques, e.g. organometallic vapor-phase epitaxy. There are some unique challenges in the fabrication of III-nitride semiconductor devices. Because III-nitride substrates are not commercially available, the epitaxial growth is forced to occur upon non-lattice-matched substrates, e.g. sapphire or SiC. The epitaxy-up orientation of the conventional III-nitride LED die requires that light be extracted out the top surface, i.e. out through the p-type III-nitride layers. But, the high resistivity of p-type III-nitride layers, e.g. GaN, requires that metallization be deposited on the p-type material surface to provide sufficient current spreading. Because such metals absorb light, a very thin p-electrode metallization (e.g., Ni/Au) is typically used to allow light to escape through the top surface. However, even these thin semi-transparent layers absorb a significant amount of light. Assuming a typical thickness of 100 Å of Au and neglecting Ni (which may be oxidized to form transparent $NiO_x$), the amount of light absorbed in this semi-transparent p-electrode is ~25% per pass at $\lambda$=500 nm. At high current densities, the metallization thickness may need to be increased to maintain uniform current injection into the active region, and to avoid generating most of the light in the vicinity of the wirebond pad. Increasing the metal thickness increases light absorption and reduces the extraction efficiency of the device. Clearly, this tradeoff should be avoided in the design of III-nitride LEDs for operations at high current densities (>40 $A/cm^2$, which is ~50 mA into a ~0.35×0.35 $mm^2$ junction area).

In FIG. 1, Nakamura et al., in U.S. Pat. No. 5,563,422, disclosed a typical prior art III-nitride LED employing a sapphire substrate. Undoped and doped III-nitride layers surround an active region. A non-planar device geometry is necessary where contact to both p and n regions occur on the same side (top) of the LED since the substrate is electrically insulating. Also, two wirebond pads are required on the top of the device. The n-side wirebond pad is also an Ohmic electrode for making electrical connection to the III-nitride epi layers. The high resistivity of the p-type III-nitride layers requires current spreading to be provided by a thin semi-transparent (partially absorbing) NiAu Ohmic electrode that is electrically connected to the p-type III-nitride layers. Light extraction efficiency is limited by the amount of surface area covered by this Ohmic electrode and by the bonding pads. The optical losses associated with the Ohmic and bondpad metal layers are accentuated by the light-guiding nature of the III-nitride materials (n~2.4) on the sapphire substrate (n~1.8).

Inoue, et. al., in EP 0 921 577 A1, disclosed a prior art III-nitride LED having an epitaxy-side down or inverted structure where the light escapes predominantly upwards through a superstrate, i.e. the sapphire growth substrate. The device design conserves active junction area and provides for the smallest possible die size. The p electrode is made of Ni and Au, which are quite absorbing to visible light. Since this device lacks a highly reflective p-electrode metallization, it is limited in terms of light extraction efficiency and does not offer a significant improvement over the conventional (epitaxy-side up) device. Also, because the devices are small (<400×400 $\mu m^2$) and use a small solder connection area to the package, they are limited in their light generating capability. Finally, this device suffers in efficiency from having guided light trapped within the III-nitride epi layers because of the low-refractive-index sapphire superstrate.

Kondoh et. al., in EP 0 926 744 A2, disclosed a prior art inverted III-nitride LED using a sapphire superstrate. The p-type electrode is silver, which is very reflective in visible light and results in a device with higher light extraction efficiency compared to the device disclosed by Inoue et. al. However, Ag adhesion to III-nitride material is poor. Upon annealing, Ag can conglomerate and destroy the integrity of the sheet Ohmic contact behavior and the reflectivity. Since the device is relatively small (<400×400 $\mu m^2$) and uses a small solder connection area to the package, it is limited in its light generating capability. Finally, this device suffers in efficiency from having guided light trapped within the III-nitride epi layers because of the low-refractive-index sapphire superstrate.

Mensz et. al., in Electronics Letters 33 (24) pp.2066–2068, disclosed a prior art inverted III-nitride LED using a sapphire superstrate. This device employs bi-layer metal p-electrodes, Ni/Al and Ni/Ag, that offer improved reflectivity compared with Ni/Au. However, these devices exhibited high forward voltages of 4.9 to 5.1 V at 20 mA in 350×350 $\mu m$ devices. This yields a series resistance of ~100 $\Omega$, which is more than three times higher than that of devices with good Ohmic electrodes. The high series resistance severely limits the power conversion efficiency. Since these devices are small (<400×400 $\mu m^2$) and not mounted for low thermal resistance, they are limited in their light generating capability. Finally, these devices suffer in efficiency from having guided light trapped within the III-nitride epi layers because of the low-refractive-index sapphire superstrate.

Edmond et.al., in WIPO WO96/09653, disclosed a vertical injection III-nitride LED on a conducting SiC substrate, shown in FIG. 2. A conductive buffer layer is required for Ohmic conduction from the III-nitride layers to the SiC substrate. The growth conditions required for a conductive buffer layer limits the growth conditions available for subsequent layers and thus restricts the quality of the III-nitride active region layers. Also, the conductive buffer layer may introduce optical loss mechanisms that limit light extraction efficiency. Furthermore, the SiC substrate must be doped to provide high electrical conductivity (ρ<0.2 Ω-cm) for low series resistance. Optical absorption resulting from SiC substrate dopants limits the light extraction efficiency of the device. These conditions result in a trade-off between series resistance and light extraction efficiency and serve to limit the electrical-to-optical power conversion efficiency of the LED in FIG. 2.

SUMMARY OF THE INVENTION

The present invention is an inverted III-nitride light-emitting device (LED) with enhanced total light generating capability. A large area (>400×400 $\mu m^2$) device has at least one n-electrode which interposes the p-electrode metallization to provide low series resistance. The p-electrode metallization is opaque, highly reflective, Ohmic (specific contact resistance less than $10^{-2}$ $\Omega cm^2$), and provides excellent current spreading. Light absorption in the p-electrode at the peak emission wavelength of the LED active region is less than 25% per pass. An intermediate material or submount may be used to provide electrical and thermal connection between the LED die and the package. The submount material may be Si to provide electronic functionality such as voltage-compliance limiting operation, protection from electrostatic discharge (ESD), series-string LED arrays, and feedback-controlled light output. The entire device, including the LED-submount interface, is designed for low thermal resistance to allow for high current density operation. Finally, the device may include a high-refractive-index (n>1.8) superstrate in which further improvements in light extraction efficiency are obtained.

BRIEF DESCRIPTION OF THE DRAWINGS

FIG. 17a shows a plan view of the structure.

FIG. 17b shows the corresponding schematic diagram.

DETAILED DESCRIPTION

One fundamental limiting condition of LED operation is maximum junction temperature. The maximum junction temperature, $T_{jmax}$, is the temperature of the p-n junction region at which breakdown or failure occurs in some part of the LED or its housing. This breakdown often occurs as the glass transition temperature of an encapsulating epoxy or lens is approached, causing loss of transparency and eventual melting of these materials. With such a limit established, $\Delta T_j$, the temperature rise from ambient to $T_{jmax}$, may be expressed as (assuming power conversion efficiency<<100% which is true for present-day III-nitride devices), $$\Delta T_j = T_{jmax} - T_a = I_{max} V_f \Phi_{j-a}, \quad (1)$$

where $T_a$ is the ambient temperature, $I_{max}$ is the maximum operating current, and $V_f$ is the forward voltage at that current, and $\Phi_{j-a}$ is the thermal resistance from the p-n junction to ambient. Inserting a simplified expression for $V_f$, and re-writing yields $$I_{max} = \Delta T_j / [\Phi_{j-a}(V_0 + I_{max} R_s)], \quad (2)$$

where $V_0$ is the turn-on voltage (approximately the III-nitride semiconductor bandgap voltage) and $R_s$ is the electrical series resistance of the device. Solving for $I_{max}$ yields $$I_{max} = [\Delta T_j/(R_s \Phi_{j-a}) + (\tfrac{1}{2} V_0/R_s)^2]^{1/2} - \tfrac{1}{2} V_0/R_s \quad (3)$$

Figure 1:
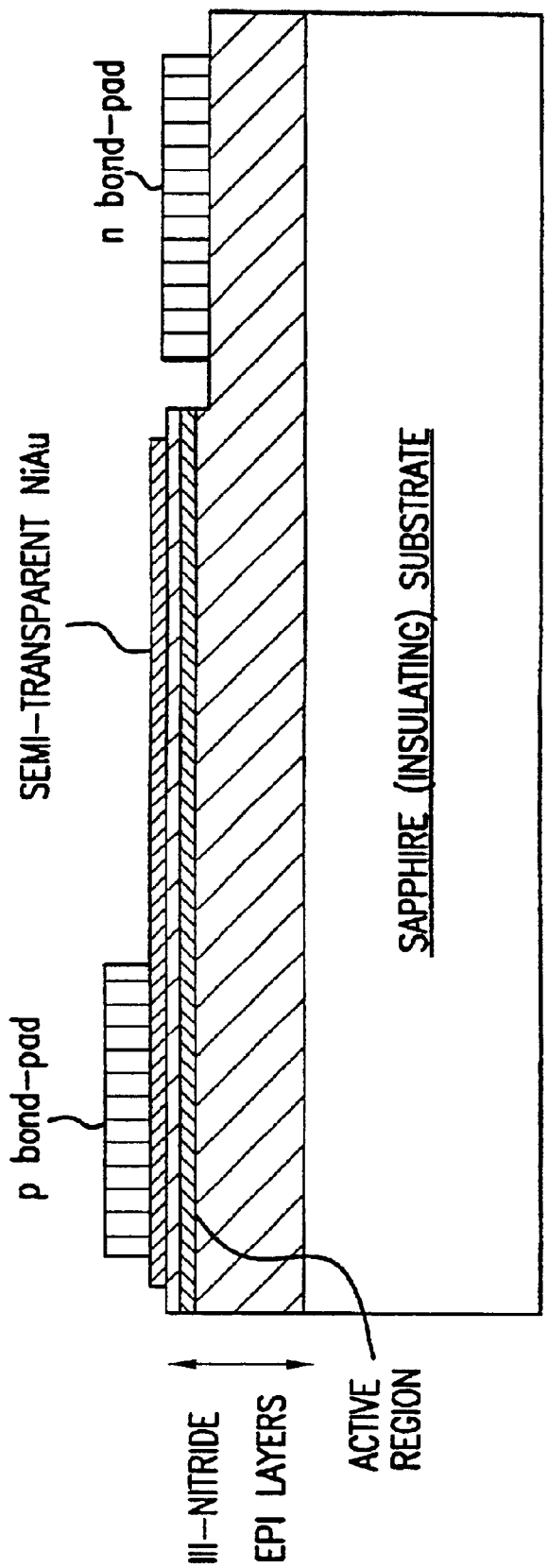
FIG. 1 shows a prior art III-nitride light emitting device with a sapphire substrate.
Figure 2:
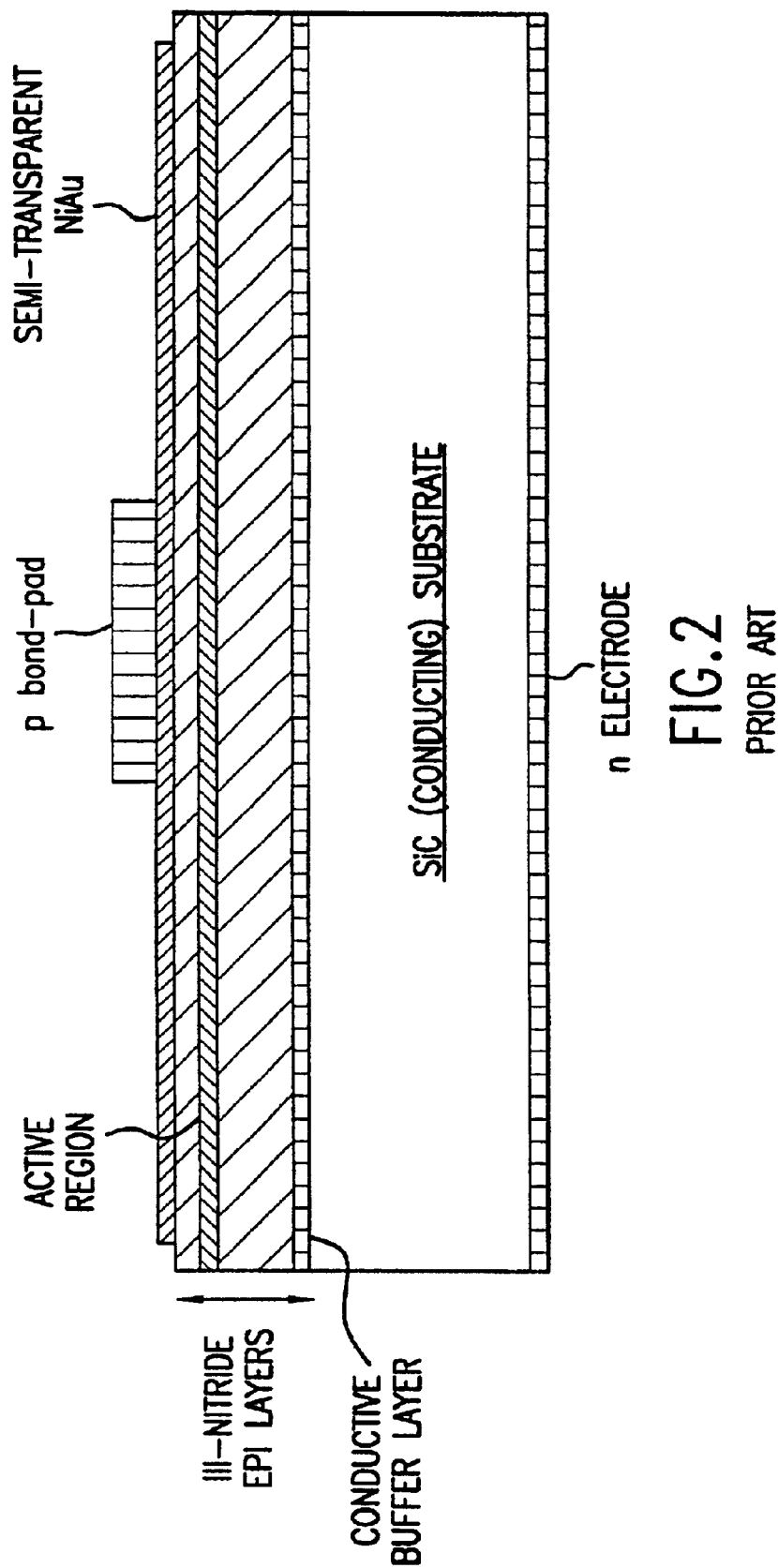
FIG. 2 shows another prior art III-nitride light emitting device a SiC substrate.
Figure 3:
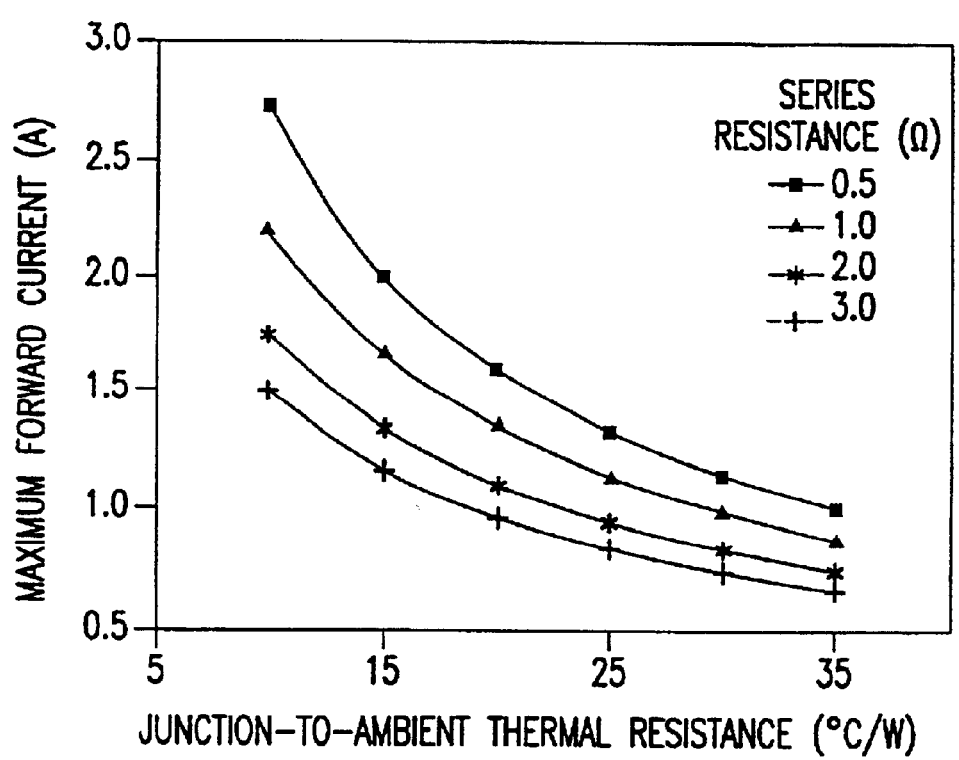
FIG. 3 shows maximum forward current as a function of the junction-to-ambient thermal resistance.

Equation 3 is plotted in FIG. 3 for the case of $V_0$=2.5 V (corresponding to an energy bandgap of wavelength, λ~500 nm) and $T_{jmax}$=130° C. for varying values of $R_s$ and $\Phi_{j-a}$. The range of values of these parameters is consistent with die dimensions of ~1 mm² and with systems that are well designed for heat removal. The rank in importance between $R_s$ and $\Phi_{j-a}$ is determined by what portion of the graph in FIG. 3 is governing the application. However, in most cases in FIG. 3, a ~5° C./W reduction in thermal resistance more efficiently increases $I_{max}$ (and thus light output) than a ~0.5 Ω drop in series resistance. Because series resistance derives from finite contact resistances and practical doping levels, it is difficult to reduce to arbitrarily low levels. Thus, it is clear that thermal resistance is a significant lever arm for increasing $I_{max}$ and that it must be minimized to maximize light generating capability.

With $I_{max}$ fixed by the limitation on junction temperature, the maximum light generating capability is described in Equation 4:

$$L_{max} = \eta I_{max} \quad (4)$$

where $L_{max}$ is the maximum light output in Watts and η is the slope efficiency of the LED in W/A. The slope efficiency is proportional to the external quantum efficiency, such that $$\eta \sim \eta_{ext} \eta_{int} C_{ext}, \quad (5)$$

where $\eta_{int}$ is the internal quantum efficiency and $C_{ext}$ is the light extraction efficiency of the LED. Thus, with a fixed active region efficiency ($\eta_{int}$), maximum light generating capability is obtained by maximizing extraction efficiency.

Since both series resistance and thermal resistance of the LED die are inversely proportional to junction area, it is desirable to increase the die size to increase $I_{max}$. Scaling up the die geometry arbitrarily runs into practical limitations of primary and secondary optics sizes and power dissipation capability of the LED package within a lighting system. Instead, the die size should be chosen to make efficient use of the allowable power dissipation provided by the LED package. In typical systems, junction-to-ambient thermal resistances are approximately ~60° C./W, as described in Hofler et.al., Electronics Letters 34, 1 (1998). A quick calculation puts an upper limit on the power dissipation of the LED package. Assuming an ambient temperature of 40° C. and a $T_{jmax}$ of 130° C., the maximum input power is (130−40)/60=1.5 W. The maximum input power may be written $$P_{max}=I_{max}V_f=I_f(V_0+I_{max}R_S)=J_{max}(V_0+J_{max}\rho_s)A_{die}, \quad (6)$$

where $J_{max}$ is the maximum forward current density in A/cm$^2$, $\rho_s$ is the die series resistivity in $\Omega$-cm$^2$, and $A_{die}$ is the die area (in cm$^2$). For efficient and cost-effective operation, reasonably high forward current densities are required. A suitable forward current density is 50 A/cm$^2$. For 350×350 $\mu$m$^2$ devices, a typical series resistance is ~30 $\Omega$, corresponding to a device resistivity on the order of $\rho_s$~4× 10$^{-2}$ $\Omega$cm$^2$. Assuming this same resistivity for Eqn.6, with $J_{max}$=50 A/cm$^2$, and a $V_0$=2.5 V (corresponding to an energy bandgap of wavelength, $\lambda$~500 nm), the required die area to achieve the maximum input power allowed by the package is 6.7×10$^{-3}$ cm$^2$, or ~800×800 $\mu$m$^2$. Smaller devices at this same power level would result in increasing forward voltages and thus lower efficiency for the same current. Likewise, smaller devices would run at higher temperatures because of increased die thermal resistance.

Because of the high resistivity of p-type III-nitride layers, LED designs employ metallization along the p-type layers to provide p-side current spreading. Therefore, because of the insulating substrate, the n-side current spreading must occur through the n-type III-nitride layers. These layers are typically ~2 $\mu$m thick with resistivities of 10$^{-3}$ $\Omega$-cm. To account for the negligible portion of a typical device resistivity, the distance required for current spreading by the n-type layers should be kept less than ~200 $\mu$m. Therefore, a device larger than 400×400 $\mu$m$^2$ requires multiple n-electrode fingers interposing the p-electrode to keep device series resistance low. As shown above, devices for high light generating capability must be large, e.g. >400×400 $\mu$m$^2$. Therefore, these devices should employ an interposing n-electrode design. This design has serious implications for an inverted structure since the n and p electrodes must be kept electrically isolated in connection to a submount.

Figure 4:
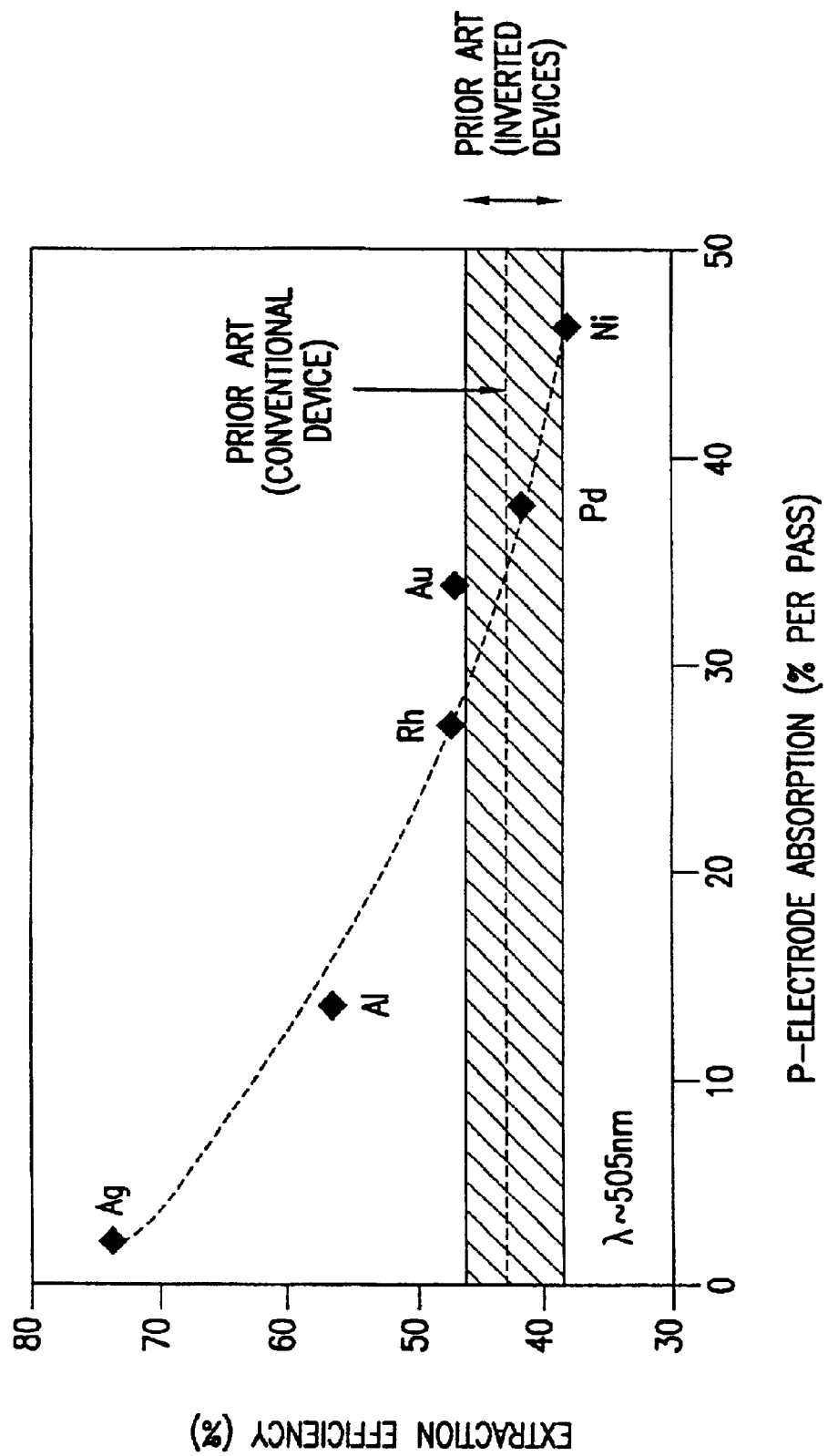
FIG. 4 shows LED extraction efficiency as a function of p-electrode absorption.
Figure 5:
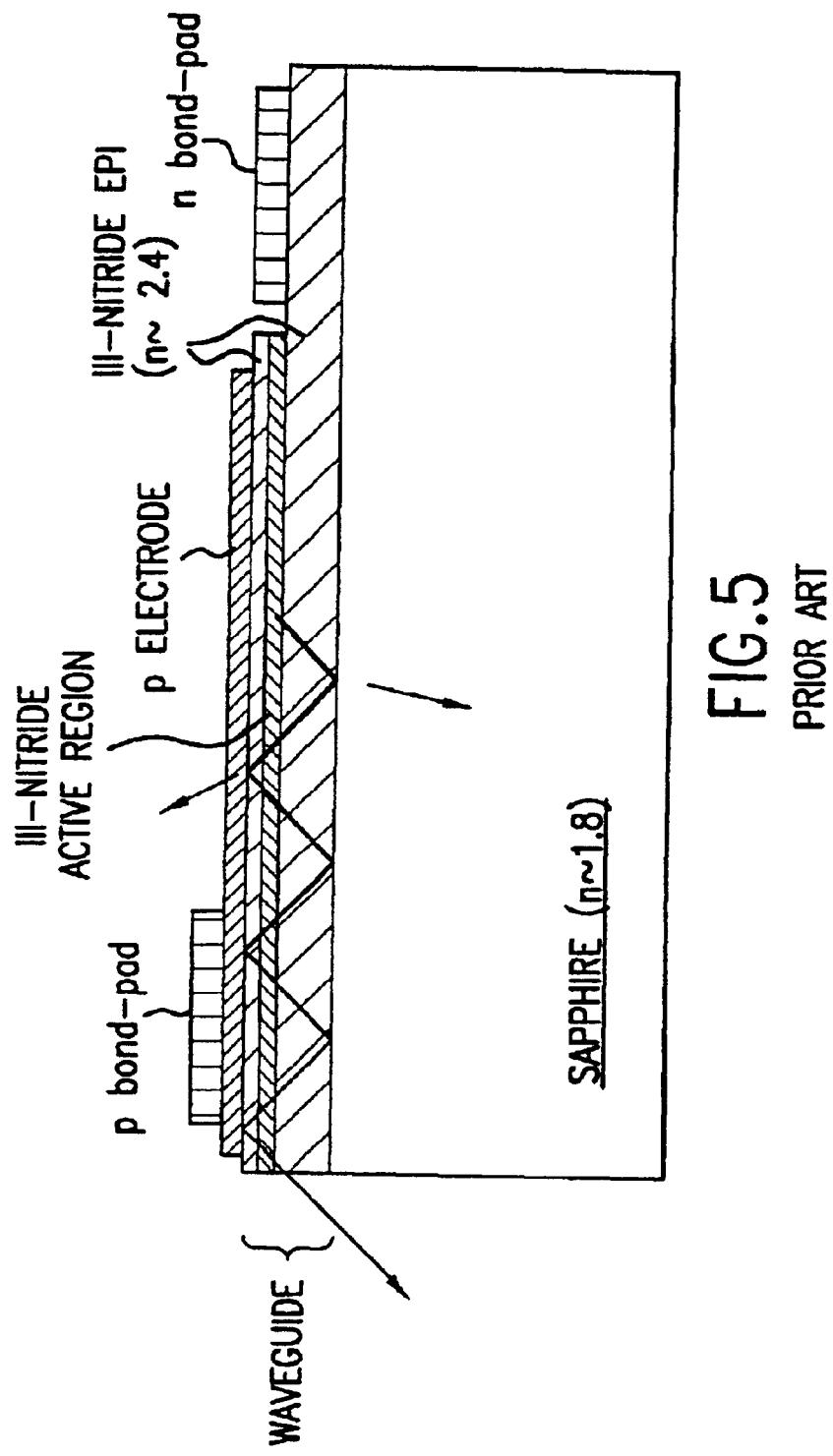
FIG. 5 shows light trapped in a prior art light-emitting device.

For an inverted design, using highly reflective electrode metallizations is critical to improve the extraction efficiency. FIG. 4 shows LED extraction efficiency vs. p-electrode absorption for an inverted die design in comparison with the conventional (epitaxy-side up) device. The extraction efficiencies plotted in FIG. 4 are determined by optical ray-trace modeling of LED die structures (1×1 mm$^2$) and include measured optical properties of all the LED materials. All of the inverted devices that were modeled employ sapphire superstrates, while the conventional devices (not inverted) use sapphire substrates. The p-electrode absorption (x-axis) is defined as the percent of light absorbed per pass assuming illumination from an isotropic point source of light within the III-nitride epi layers adjacent to the p-electrode at the wavelength of interest. The p electrode is the dominant factor for light extraction because it extends almost completely across the active area to provide uniform current injection into the p-n junction. Furthermore, the refractive index difference between the sapphire (n~1.8) and the III-nitride epitaxial layers (n~2.4) results in a large portion of the light generated from the active region being totally-internally-reflected at the sapphire/III-nitride interface. The amount of light trapped in this waveguide is ~cos((1.8/2.4)$^{-1}$)=66% of the total generated light, for isotropic emission from the active region. This light is trapped and guided laterally along the device towards the sides of the die, as illustrated in FIG. 5. While FIG. 5 shows a conventional (epitaxy-up) structure, the waveguiding effect is present whether the die is epitaxy-up or inverted. However, because of absorption by the p-electrode, most of the waveguided light is lost before escaping the device. For this reason, extraction efficiency is very sensitive to p-electrode absorption as shown by the data plotted in FIG. 4. This is especially significant in large-area, e.g. >400×400 $\mu$m$^2$, die since the number of passes at the p-electrode before escape is very large. The n electrode is also an optical loss mechanism, but is less significant because it covers less device area.

The ray-trace modeling results shown in FIG. 4 suggest that inverted die designs having Ni and/or Au electrodes provide extraction efficiencies from 38 to 47% ($\lambda$=505 nm). Conventional epitaxy-side-up devices with semi-transparent NiAu electrodes have an extraction efficiency of 43%. Hence, a Ni and/or Au p electrode in an inverted device does not provide significantly improved extraction efficiency relative to the conventional design. For an Ag p-electrode, however, the inverted die exhibits a ~1.7× gain in extraction efficiency over the conventional device. As shown explicitly in FIG. 4, to provide increased light extraction beyond a prior art device, the p electrode absorption in an inverted device should be less than 35%. Preferably, the p electrode absorption is less than 25%. While FIG. 4 is plotted for the case of 505 nm, the trend in extraction efficiency vs. p-electrode absorption is true regardless of wavelength. It is also important to point out that, while reflectivity is a prime consideration, so also is contact resistance. Poor contact resistance in the p electrode can result in a device with excessively high series resistance and thus reduced light generation capability as described by Equation 3. For 350× 350 $\mu$m$^2$ devices, a typical series resistance is ~30 $\Omega$, corresponding to a device resistivity on the order of 4×10$^{-2}$ $\Omega$cm$^2$. The p contact resistivity should be much less than this to minimize its contribution to the series resistance. In the present invention, the p specific contact resistivity is preferably less than 10$^{-2}$ $\Omega$cm$^2$.

The combination of low optical absorption and low contact resistivity in a manufacturable process are difficult to achieve for III-nitride devices. For example, Ag makes a good p-type Ohmic contact and is very reflective, but suffers from poor adhesion to III-nitride layers and from susceptibility to electro-migration in humid environments which can lead to catastrophic device failure. Al is reasonably reflective but does not make good Ohmic contact to p-type III-nitride materials, while other elemental metals are fairly absorbing (>25% absorption per pass in the visible wavelength regime). A possible solution is to use a multi-layer contact which includes a very thin semi-transparent Ohmic contact in conjunction with a thick reflective layer which acts as a current spreading layer. An optional barrier layer is included between the Ohmic layer and the reflective layer. One example of a p-type multi-layer contact is Au/NiO$_x$/Al. Typical thicknesses for this metallization scheme are 30/100/1500 Å. Similarly, a suitable n-type GaN multi-layer contact is Ti/Al with typical thicknesses of 30/1500 Å.

Since the p-electrode reflectivity is a dominant factor in extraction efficiency, it must not be compromised in designing for manufacturability. Even though on-wafer testing of inverted III-nitride LEDs is made difficult by the opaque sheet metallization, methods for such testing must not require degrading the reflective nature of the p electrode. For example, openings or semi-transparent regions inserted in the p electrode to allow light to escape upward during on-wafer testing only serve to degrade the efficiency of the finished device, by effectively reducing the p electrode reflectivity. Other methods that do not compromise the p-contact reflectivity should be used.

Figure 6A:
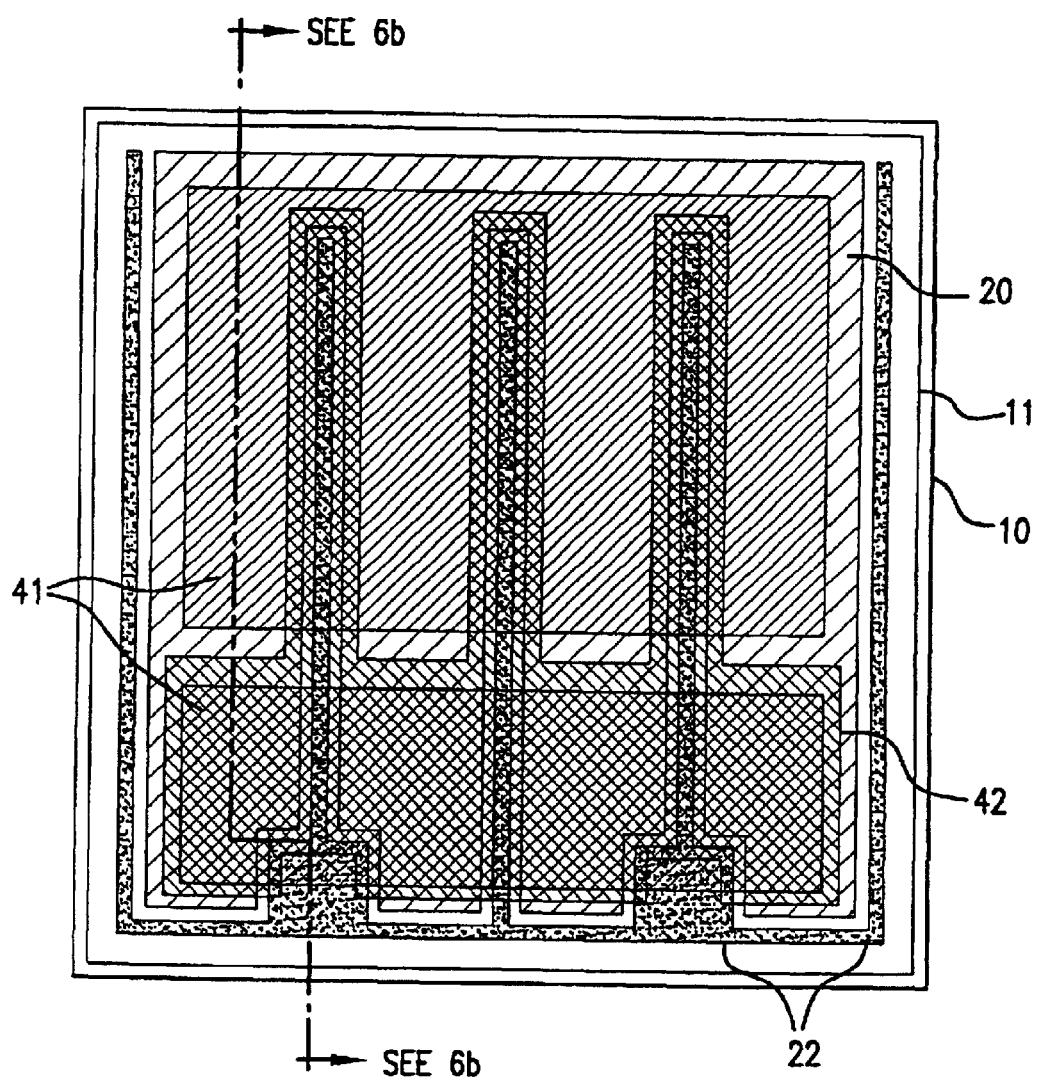
FIGS. 6a–b illustrate the plan and cross-sectional views of an embodiment of the present invention, respectively.

The present invention provides for a large-area, e.g. >400×400 $\mu$m$^2$, high-power LED with maximum light generating capability by reducing the thermal resistance from the p-n junction to the lamp package while increasing light extraction. To accomplish this, the present invention uses an inverted structure employing a low resistivity, opaque, highly reflective p-electrode. A first embodiment is shown in FIGS. 6a–b.

Figure 6B:
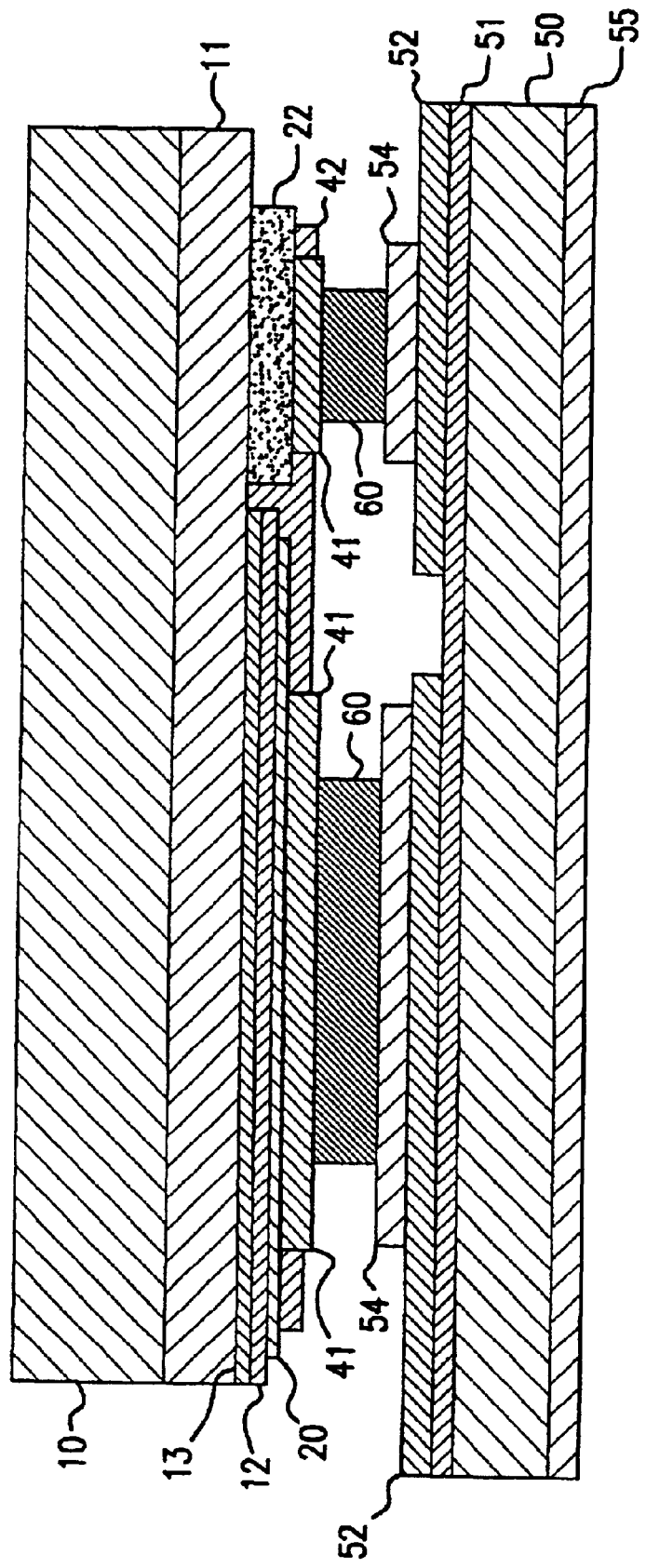

In the cross-sectional view shown in FIG. 6b, the device includes an III nitride epitaxial heterostructure of n-type layers 11 and p-type layers 12, each in contact with an active region 13. The n-type layers 11 may include one or more undoped layers and are optionally attached to a transparent superstrate 10. The superstrate 10 can be the growth substrate for deposition of the III nitride layers. In the plan view of the bottom of the LED die shown in FIG. 6a, the large area of the device (>400×400 $\mu$m2) requires n-electrode 22 "fingers" interposing the p-electrode metallization 20 to spread current uniformly throughout the device. Such an electrode configuration is required in large-area devices to provide a low series resistance (to overcome the low conductivity III nitride layers) and thus provide a high maximum drive current as specified in Equation 3. Thus, the interposed n-electrode configuration is required for large-area devices for maximizing total light generation capability. The device is inverted so that light may be taken out through the transparent superstrate 10 as well as the sidewalls and provides good extraction efficiency by using a highly reflective, thick p-electrode metallization 20. The reflectivity of the p-electrode is such that its absorption at the LED emission wavelength is less than 25% per pass, as described above. The electrode metallizations connect to submount electrodes 52 on a submount substrate 50 via interconnects 60. The interconnects make electrical connection between the LED and the submount while providing a thermal path for heat removal from the LED during operation. Although the illustrated embodiments refer to solder, the interconnects may be made of elemental metals, metal alloys, semiconductor-metal alloys, solders, thermally and electrically conductive pastes or compounds (e.g., epoxies), eutectic joints (e.g., Pd-In-Pd) between dissimilar metals between the LED die and submount, Au stud-bumps, or solder bumps.

The interconnects are attached to the LED and submount via conductive interfaces 41, 54. When solder is used as the interconnect, the conductive interfaces are wettable metals. An application process initially determines the interconnect thickness and area. One applicable technique is a screen-printing process where paste is applied to select areas on the submount wafer or LED. Other techniques include electroplating, lift-off, and reflow. For an embodiment using solder as the interconnect, the final interconnect thickness and area are determined by the solder volume as well as the conductive interfaces 41 on the LED die and 54 on the submount. The solderable areas on the LED are defined through patterning of the wetting metals, or through vias in a patterned dielectric passivation layer 42 provided on the LED die. The dielectric passivation 42 layer acts as an electrical isolation layer between the p and n electrodes and is required since the conductive interfaces 41 extend across both p and n electrodes. The solderable areas on the submount are similarly defined by patterning the solderable metals 54. In an alternate embodiment, the wettable areas of the metallization 54 may be defined by a patterned dielectric layer. A second set of solderable metal layers 55 may be deposited on the back of the submount for attachment to the package. Optionally, a suitable solder can be deposited directly on the back of the submount. Because the thermal conductivity of any underfill material between the LED and submount is very low, e.g. <2.0 W/mK, the junction-to-package thermal resistance is largely governed by the die/submount solder joint and the submount material and geometry. Assuming heat generation at the p-electrode metallization and one-dimensional flow and ignoring the thermal resistances of thin layers and the submount-package solder joint, the junction-to-package thermal resistance may be written as $$\Phi_{j\text{-}p} = (t_s/\rho_s + t_{sm}/\rho_{sm})/A_s, \text{ (dielectric ignored)} \quad (7)$$

where $t_s$ and $t_{sm}$ are the thicknesses, and $\rho_s$ and $\rho_{sm}$ are the thermal conductivities, of the solder and submount, respectively, and $A_s$ is the total cross-sectional area of the solder. As shown in Equation 6, the solder area, $A_s$, controls thermal resistance. Hence, it is desirable to cover the entire surface of the LED die with the solder. This is not possible as electrical isolation is required between the p and n electrode regions of the LED. Also, the width of this gap between the n and p solderable metals must account for tolerances in die attaching to the submount. Even so, the embodiment in FIG. 6a provides ~85% solder coverage (defined as the ratio of solderable metal area 41 relative to the p electrode area 20).

An alternate embodiment to that shown in FIGS. 6a–b includes a sheet reflector that comprises a portion of the p electrode 20 and extends beneath portions of the n electrode 22. An intermetal dielectric is formed between these regions of the n-electrode and the sheet reflector. The intermetal dielectric provides electrical isolation between the n and p electrodes in these regions. Other portions of the n electrode are not covered by the dielectric, to allow electrical connection to the submount. This embodiment reduces light leakage downward through gaps in the LED metallization, compared to the embodiment shown in FIGS. 6a–b, by reflecting this light upwards.

Figure 7:
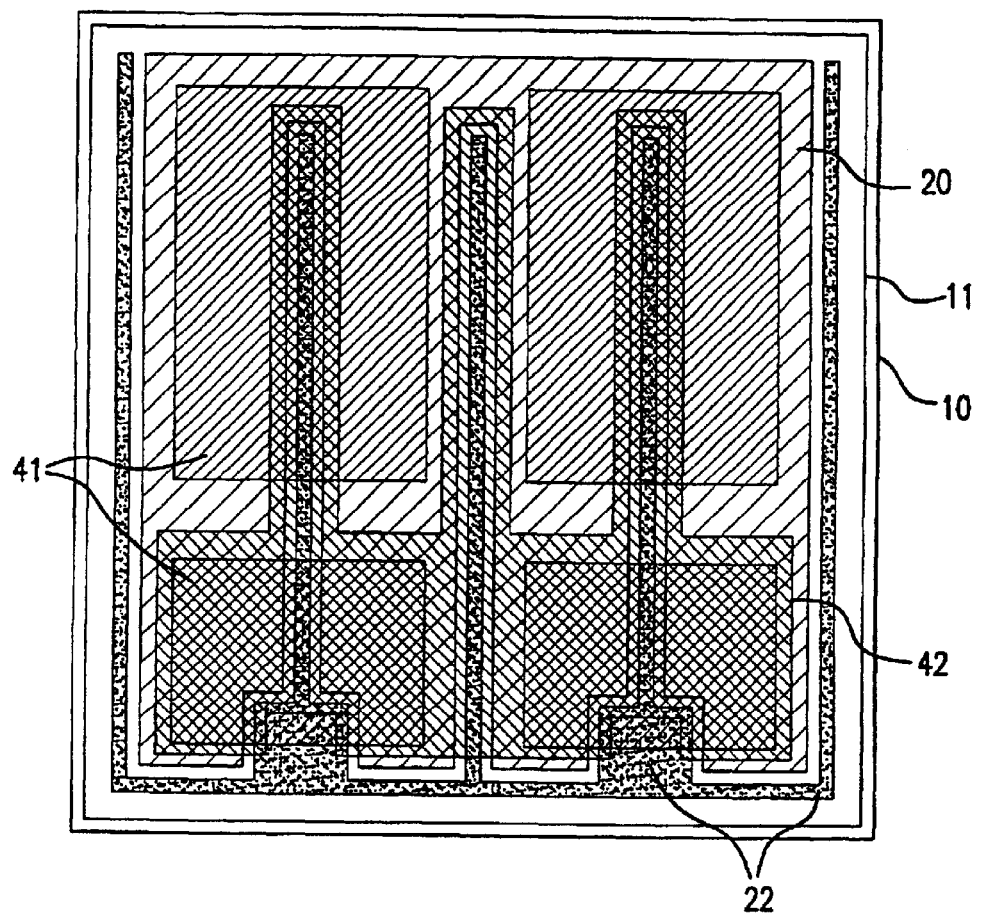
FIG. 7 illustrates an embodiment of the present invention.

The interconnect between the LED and submount is made when the solder is placed in a reflow oven at a temperature above the solid temperature of the solder alloy. During reflow, capillary forces and surface tension tend to align solderable metal areas to the solder sheets. This allows for some self-realignment of the LED die to the submount wafer. This self-realignment can be exploited through the use of a fast die-attach machine, allowing one to trade-off initial die-attach accuracy for speed. Further breaking up each p and n solder sheet into multiple sheets can improve self-realignment. In FIG. 7, the embodiment shows the p and n solder pads 41 in pairs. The gaps between the solder sheets are determined by the accuracy of the die-attach machine. The embodiment of FIG. 7 has superior self-realignment characteristics in the x and y directions while the embodiment of FIG. 6a has predominantly self-realignment characteristics in the y direction.

Figure 8:
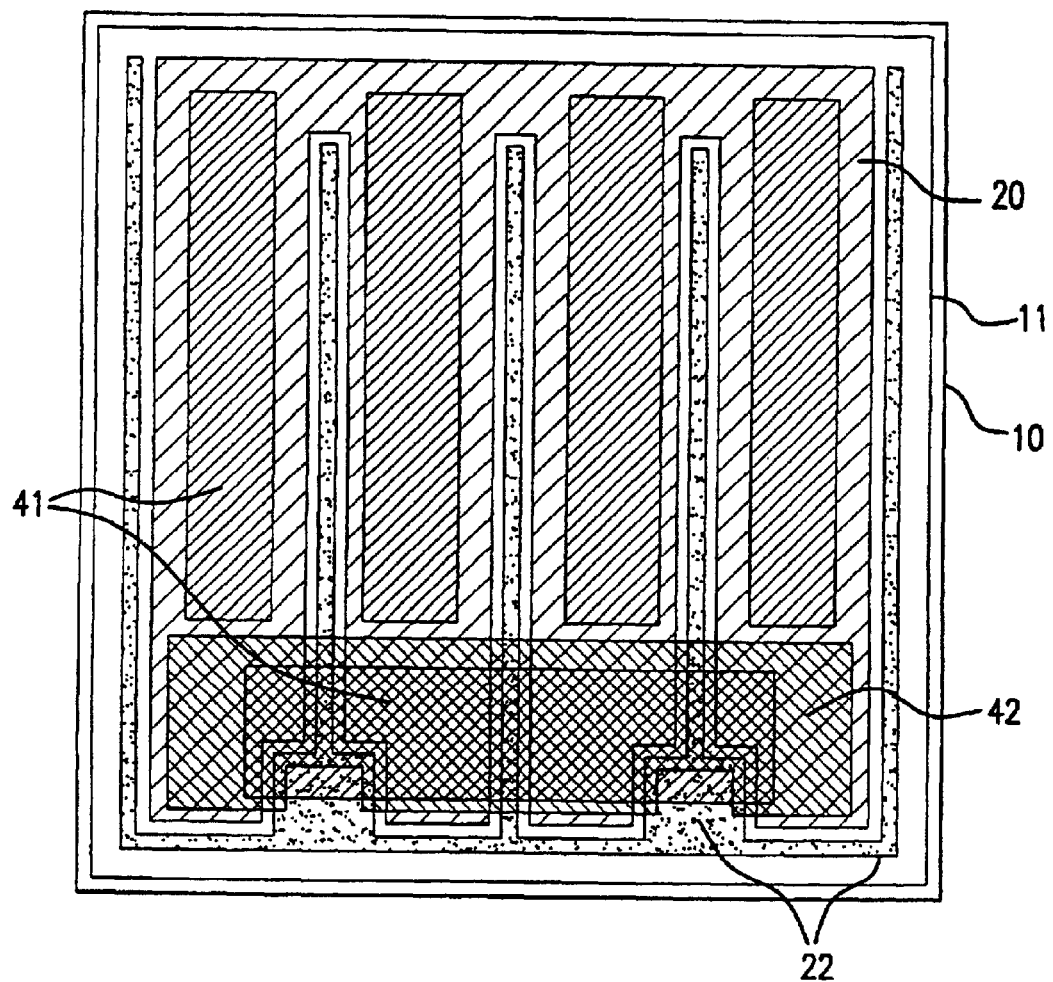
FIG. 8 illustrates an embodiment of the present invention.

In FIG. 8, the alternate embodiment shows the solderable metals 41 as solder "bars" of equal area. This design has the benefit of good self-realignment along with uniform wetting of the solderable metals during reflow. Uniform wetting occurs because the forces applied between the die and submount are proportional to the area of solder wetting. Uniform wetting is achieved by using a wettable metal pattern that consists of regions of equal area. Uniform wetting prevents the LED die from tilting during reflow and the subsequent cool-down. Maintaining a planar LED attach process means the LED die is less likely to undergo failure mechanisms, e.g. shorting of the p-n junction, which may emerge in the case where portions of the LED die are in close proximity to metallized areas on the submount. Also, the non-tilted LED die orientation provides improved light coupling to the other optical components in the LED lamp or system.

Figure 9:
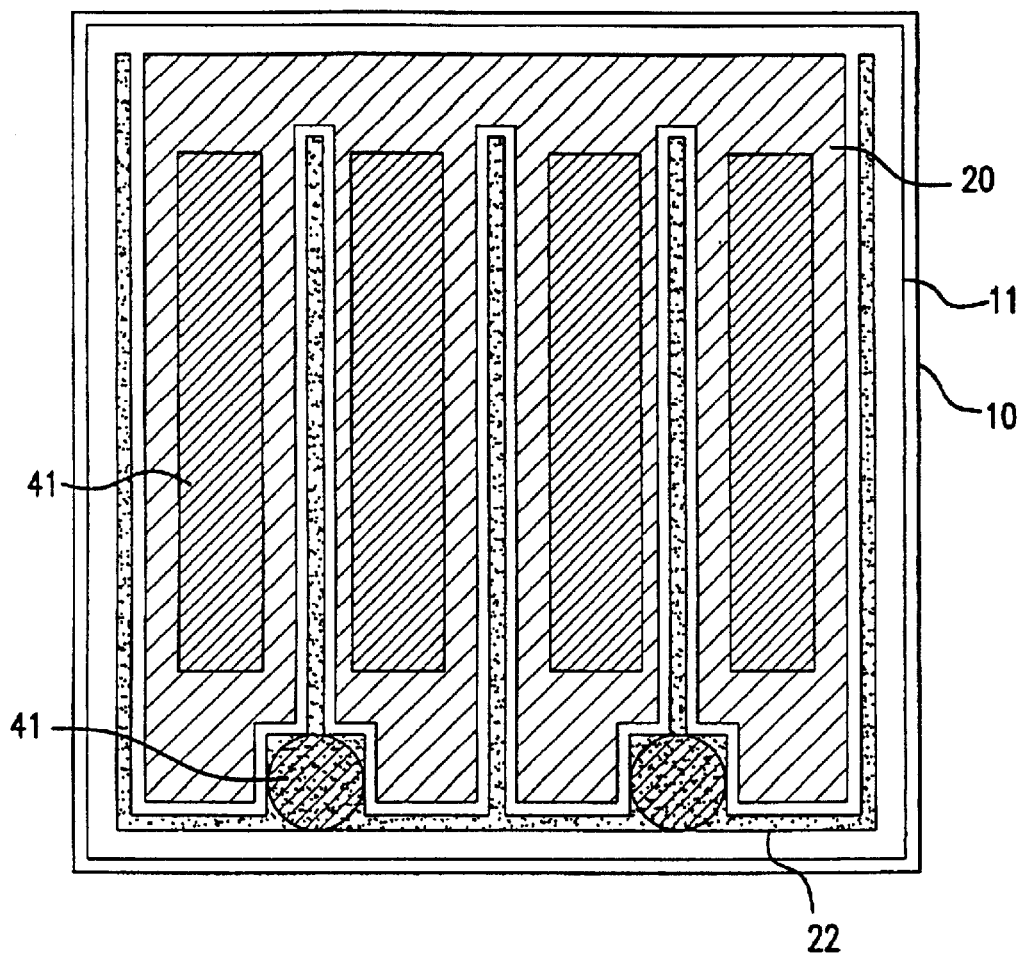
FIG. 9 illustrates an embodiment of the present invention.

In FIG. 9, another embodiment shows the n region solderable metal changed to pads for solder "bumps". The wafer fabrication process is simplified since isolation between the n and p electrodes are no longer required in the vicinity of the n solder pads hence eliminating the need for the dielectric passivation layer 42. The solder bump fabrication is an industry-standard practice, allowing solder connections at the n electrodes to be provided through well-established manufacturing techniques.

Figure 10A:
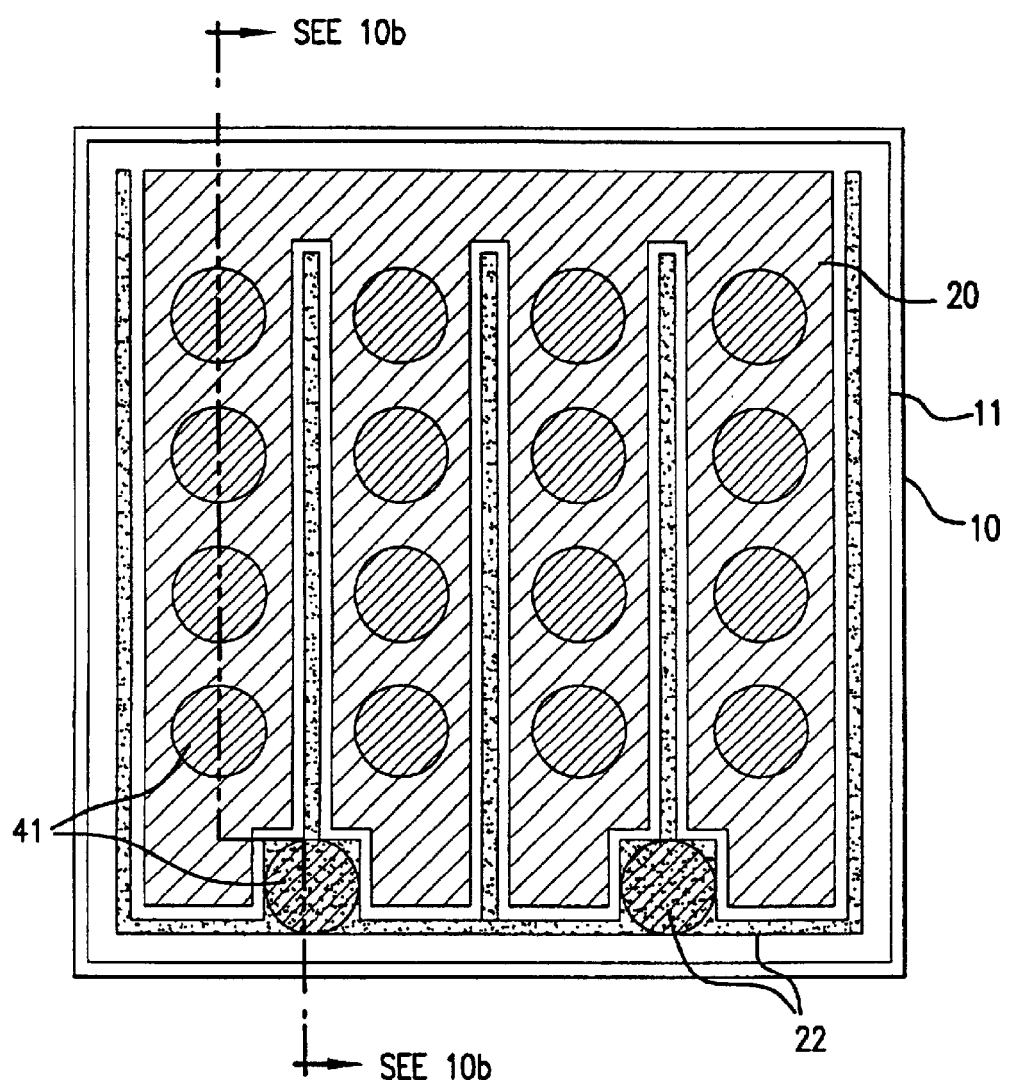
FIGS. 10a–b illustrate the plan and cross-sectional views of an embodiment of the present invention, respectively.
Figure 10B:
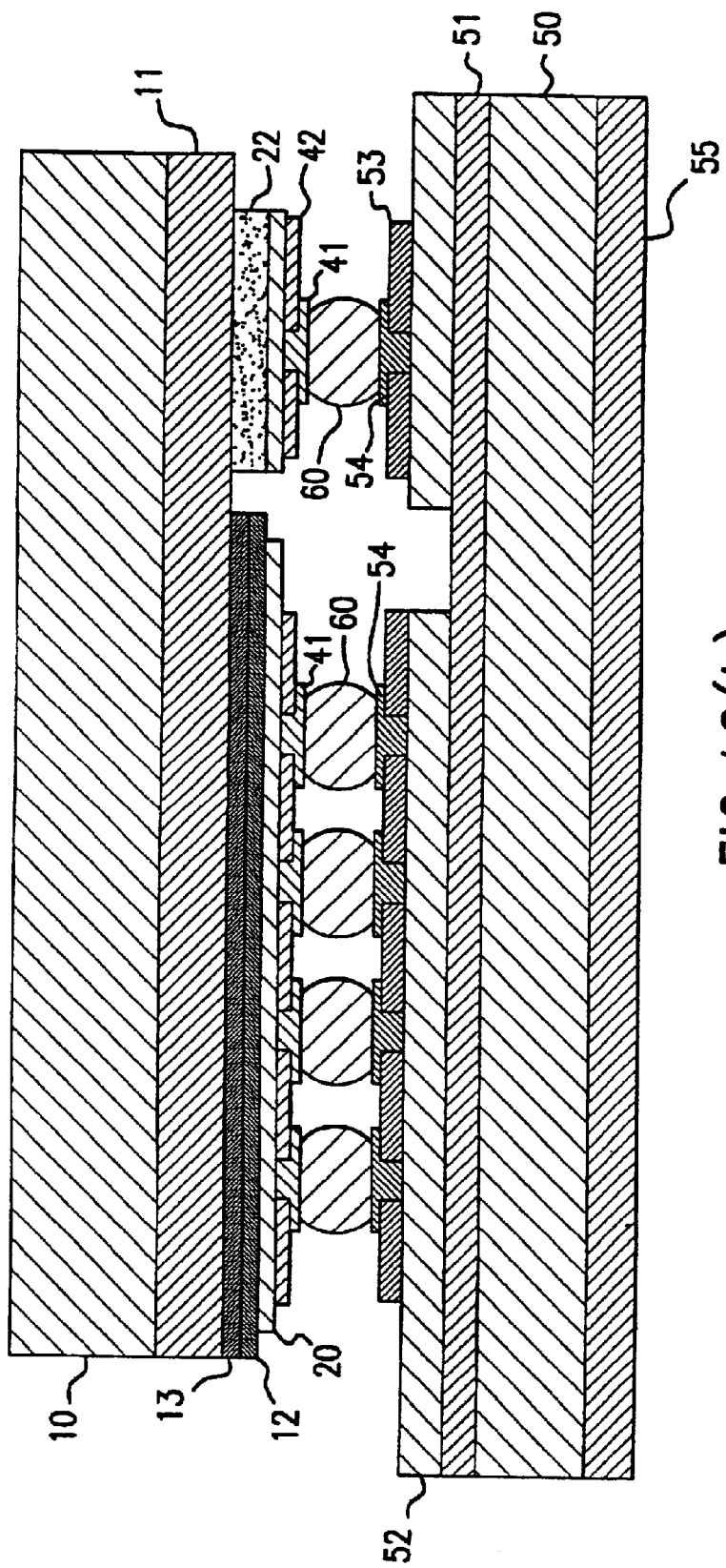
Figure 11A:
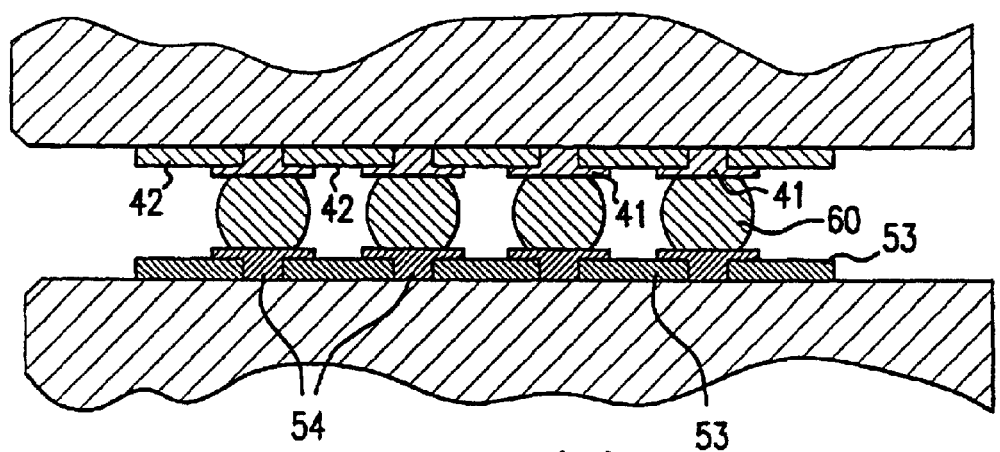
FIGS. 11a–b illustrate cross-sectional views of the embodiment shown in FIGS. 10a–b.
Figure 11B:
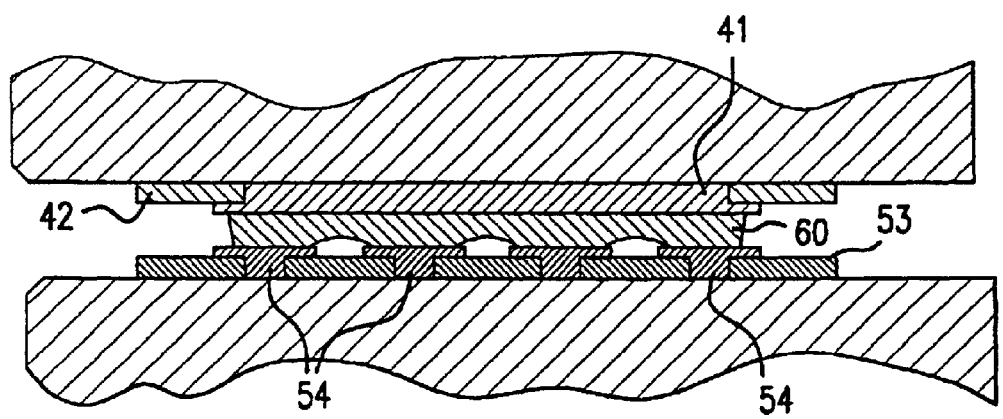

In an alternate embodiment, the plan and cross-sectional views shown in FIGS. 10a and 10b respectively, the entire solder attach interface is provided by solder pads for bumps. To minimize thermal resistance, the number of bumps is maximized to increase the final cross-sectional solder joint area, while minimizing the final solder thickness. The number of bumps is dictated by the state-of-the-art in solder bump formation which puts limits on solder-bump pitch for a given bump diameter. A typical pitch is 200 $\mu$m for 100 $\mu$m diameter bumps. For a 1 mm$^2$ die, five rows of 100 $\mu$m diameter bumps are feasible. In FIG. 10a, one row is two bumps for the n pads. The n-electrode fingers limit the number of bump rows along the p-electrode metallization to four. In this design, the solder area cross-section is maintained to be at least 15% of the area of the p-electrode. The solder area coverage may be increased by expanding the wettable metal surface area beyond the small vias required for individual bumps. For example, the wettable metal pattern on the LED die may consist of bars, shown in FIG. 8, while the solder bumps on the submount are still in the form of a 4×4 array for the p-electrode plus two for the n-electrode. FIGS. 11a and 11b show cross-sectional views of this embodiment. FIG. 11a shows an embodiment that includes vias within a patterned dielectric 42 for solder pads 41 on the LED die. Likewise, a patterned dielectric 53 is provided with vias for solder pads 54 on the submount. In the embodiment shown in FIG. 11b, the solderable metal 41 on the LED die is made larger than the solder bumps in order to allow the solder to spread out and wet an area much larger than their individual diameters would provide. This results in a solder area coverage in excess of that of the sum of the individual bumps in FIG. 11a. Also, the solder thickness is effectively reduced. Both of these effects reduce the thermal resistance of the solder junction and allow the LED die to be driven to higher current densities for increased light output.

Figure 12A:
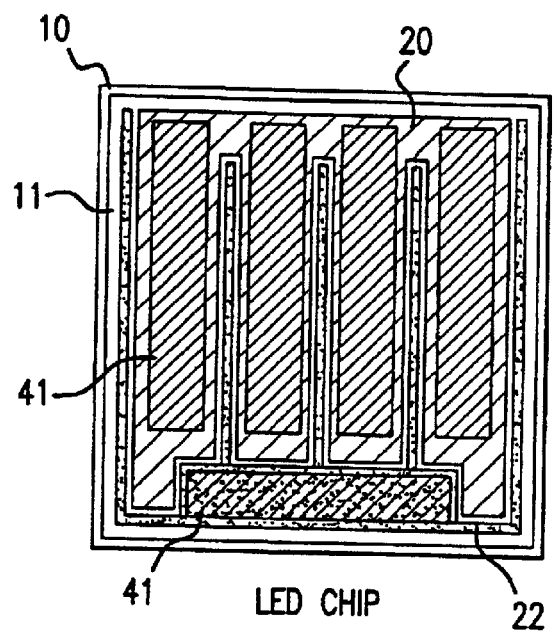
FIGS. 12a–b illustrate the plan views of an embodiment of the present invention, respectively.
Figure 12B:
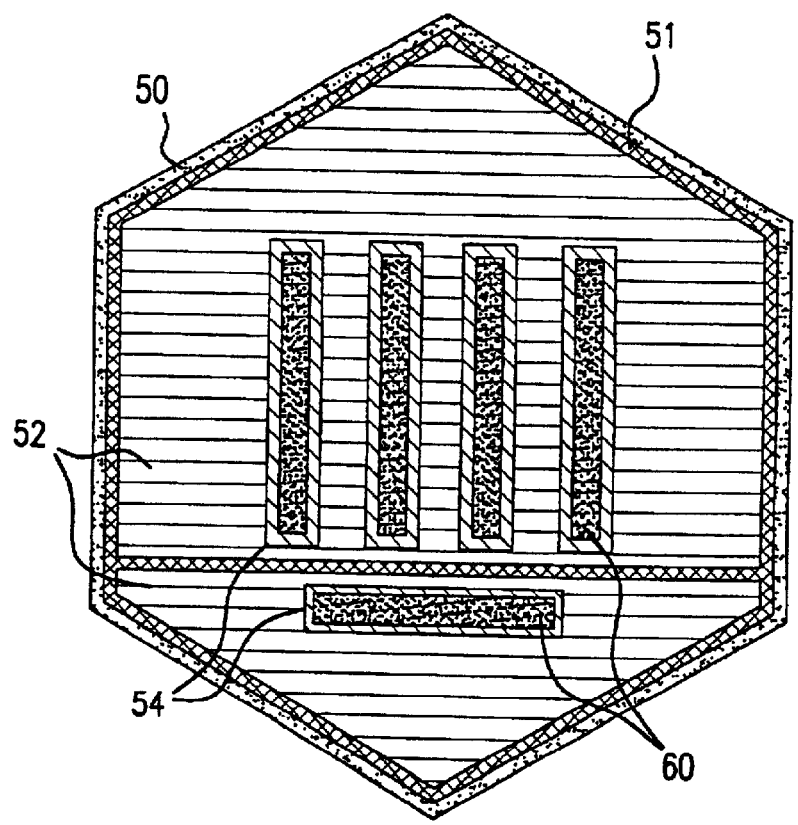

It is further possible to form the solder into arbitrary shapes other than bumps to match the wettable metal patterns on the LED to provide for a device with excellent thermal contact to the submount, shown in FIGS. 12a–b.

FIG. 12a shows a plan view of the bottom of the LED. Solderable metals 41 are patterned on the p-electrode 20 and n-electrode 22 metallizations, defining wetting areas for the solder during reflow. Alternatively, the wetting areas may be defined by a dielectric passivation layer 42 as shown in FIGS. 6–8. FIG. 12b shows a plan view of the submount. While the lateral submount geometry is arbitrary, a hexagonal design is shown. The submount includes a substrate 50, e.g. Si. An optional dielectric layer 51, e.g. SiO$_2$, may be included for electrical isolation between the LED die and the submount substrate. Alternatively, the submount substrate may be electrically connected to the LED die for integration with electronic circuits fabricated into the submount substrate. Metallization 52, e.g. Ag or Al, is provided as a reflector for downwardly emitting light from the LED die as well as for wirebonding. A break in the metallization 52 is provided to electrically isolate the p and n regions of the LED die after attachment. Solderable metals 54 are patterned on top of the wirebond metallization 52 to define wetting areas for the solder during reflow. These patterns match those of the solderable metallization 41 on the LED die. As for the LED die, the wetting areas on the submount may be defined by a dielectric passivation layer 53 as shown in FIG. 10b. Solder material 60 is deposited on the submount solderable metallization 54. Alternatively, the solder material 60 may be deposited on the LED die. The edges of the solder may be recessed slightly from the edges of the solderable metal patterns 54. Control over the solder layout, defined by the wetting areas 41 and 54 and solder pattern 60, depends upon the solder application process. It is preferable that as much of the p-electrode 20 as possible is covered with solder after reflow. The wetting areas in FIGS. 12a–b provide ~66% coverage of the p-electrode 20 with solder. While the solder layout in FIGS. 12a–b is comprised of bars, arbitrary patterns are certainly possible and allow for further increase in solder area coverage of the p-electrode.

A suitable interconnect between the LED and submount can allow the maximum operating temperature of the LED to be increased beyond 130° C., the typical maximum rating. This is the case when the interconnect is thermally stable at temperatures greater than 130° C. In the case of solder, therefore, it is desirable to use high-temperature solders, e.g. 95/5 Pb/Sn, AuSn, AuSi, and AlSi, for this interface. A high-temperature interconnect raises the maximum junction temperature of the LED and provides a significant increase in maximum driving current and thus light generating capability.

It is important to maintain the integrity of the p electrode during solder reflow. That is, the reflectivity and contact resistance of this layer should not be degraded by the presence of solderable metal layers or the solder itself. Such degradation may be caused by metal intermixing between the p electrode and the solderable metal layers, or by strain-induced effects such as delamination. For this reason, it may be necessary to provide barrier layers between the p electrode and the solderable metals. Suitable barrier layers include, but are not limited to, Ni, Cr, Cu, and Ti.

For large LED die dimensions, the difference in the coefficient of thermal expansion (CTE) between the LED die, the submount, and the casing, may cause fatigue and eventual failure at the LED/submount attach interface under thermal cycling stress conditions. The CTE problem is most likely to occur for large sheet-solder attach designs than for smaller sheets (or bars or bumps). Therefore, smaller solder shapes may be a preferable method for attaching large LED die. Also, thicker solder sheets or taller solder bumps may provide more compliance between the LED and submount, reducing the risk of failure. The trade-off here between minimizing thermal resistance and the onset of CTE problems results in an optimum solder attach design for a given LED die size. For a 1 mm² die and 15% solder area coverage, the solder thickness may be as little as 20 µm without causing failures during temperature-cycling stress conditions.

Figure 13A:
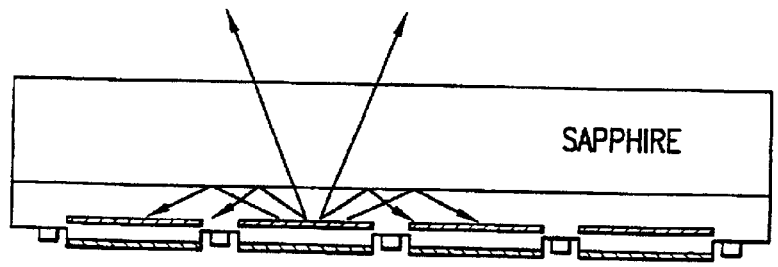
FIGS. 13a–c illustrate alternate embodiments of the present invention.
Figure 13B:
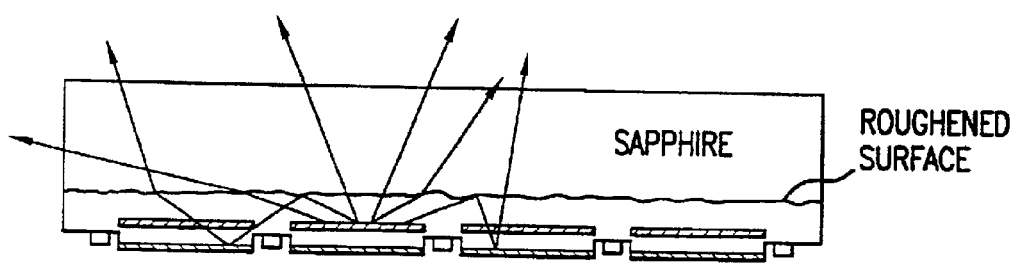
Figure 13C:
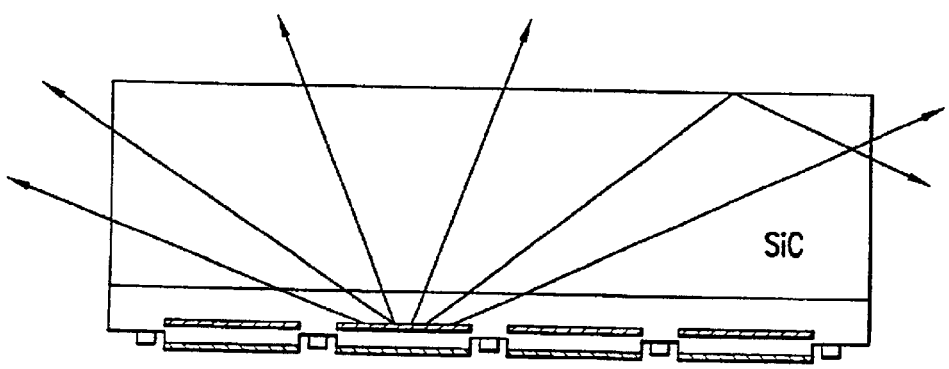

Light extraction of the LED can be increased by providing a textured surface at one of the interfaces of the III-nitride heterostructure. The texturing may be random or ordered. This is illustrated in FIGS. 13a–c. FIG. 13a shows an inverted device employing a sapphire superstrate. The large refractive index mismatch (n~0.6) between the sapphire superstrate and the III-nitride epitaxial layers results in a large portion of the light generated from the active region to be totally-internally-reflected at the sapphire/III-nitride interface. This light is trapped and guided laterally along the device towards the sides of the die. However, because of the many loss mechanisms present in the III-nitride epi layers and electrodes, most of the waveguided light is lost before escaping the device. In FIG. 13b, the interface between the III-nitride heterostructure and the sapphire superstrate is textured in order to scatter light out of the III-nitride layers. This reduces the mean photon path-length within the heterostructure and reduces the effect of internal absorption, thus improving light extraction. A similar effect can be achieved by texturing the bottom surface of the III-nitride heterstructure, or at one of the interfaces within the heterostructure. Multiple interfaces may be textured in combination to further increase light extraction.

In an alternate embodiment, light extraction is improved by providing an inverted die configuration which includes a high-refractive-index (HRI) (n>1.8) superstrate that has a closer index match to the III-nitride layers (n~2.4) than sapphire (n~1.8). A closer index match to the III-nitride layers making up the light generating regions allows more light to be coupled into the thick superstrate and allows light to escape into the ambient before absorption at one of the many loss mechanisms present in and around the III-nitride epitaxial layers. FIG. 13c illustrates such an embodiment, wherein a SiC superstrate is used. The refractive index of SiC is ~2.6 and is much closer matched to GaN than sapphire is. Thus, there is very little probability for total internal reflection and consequently no waveguide is formed within the III-nitride layers. Virtually all light generated from the active region is coupled into the superstrate and has a high probability for escape through one of the five exposed superstrate surfaces. Even with an HRI superstrate, further improvement in light extraction can be gained by texturing one or more interfaces of the III-nitride heterostructure.

Figure 14:
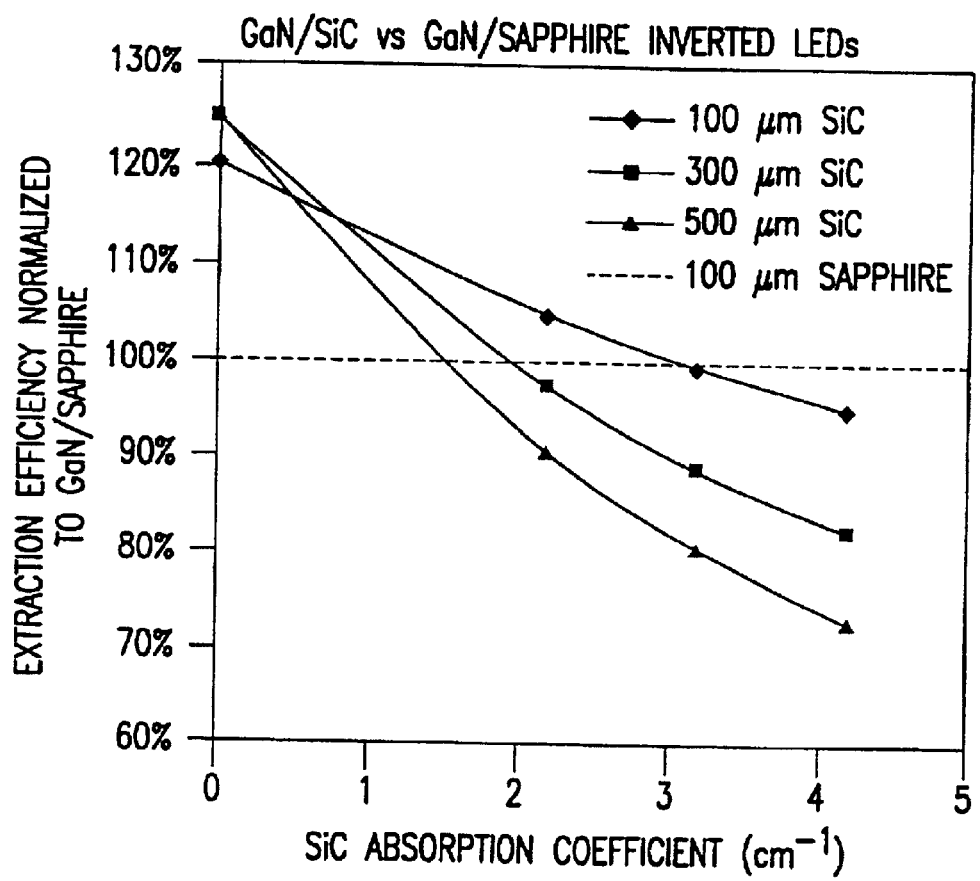
FIG. 14 shows extraction efficiency of GaN/SiC inverted LEDs as a function of the SiC absorption coefficient.

To derive full benefit of a HRI superstrate, the superstrate must be substantially transparent with very little absorption. Thus, for SiC, the superstrate should be lightly doped or not doped at all, and the growth method should provide a superstrate relatively free of impurities to provide a very low loss optical window for the LED device. For 6H SiC, this is generally the case when the resistivity is greater than 0.5 Ωcm. The effects of absorptive loss within SiC are quantified in FIG. 14, where extraction efficiency (normalized to a device using a sapphire superstrate) is plotted as a function of distributed loss (absorption coefficient, in cm$^{-1}$) within the SiC superstrate. These results are obtained by ray-trace modeling of the LED device structures. Three different thicknesses of SiC are shown. For a SiC superstrate ~100 µm thick, the absorption coefficient should be less than 3 cm$^{-1}$. For thicker substrates, the absorption coefficient must be lower. In the case of a lossless SiC superstrate, the extraction efficiency gains are greater than 1.2× over earlier embodiments within the present invention.

There are many HRI superstrates suitable for improving the light extraction efficiency of a III-nitride LED. In addition to SiC in its many different polytypes (2H, 4H, 6H, both c- and a-axis, 3C, etc.), other materials such as ZnS, ZnSe, YAG, or ZnO, may be used. The HRI superstrates may serve as growth substrates for the III-nitride epi layers or may be attached to the III-nitride epi layers by bonding or a second growth step.

Figure 15:
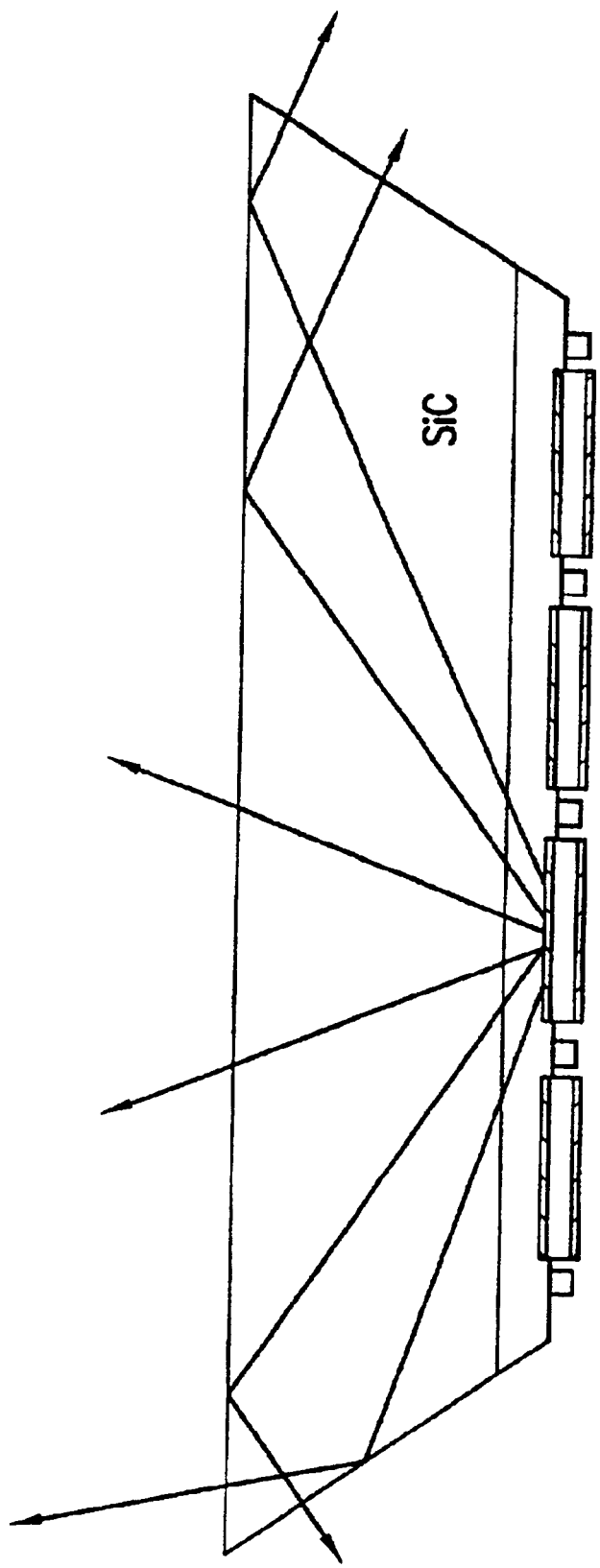
FIG. 15 illustrates an embodiment having an inverted pyramid for the superstrate.

Significant benefit to extraction efficiency may be obtained by providing a light-randomizing surface at one or more of the faces of the HRI superstrate as well on or within the III-nitride heterostructure. Such surfaces are provided naturally on device sidewalls by sawing, for example, or may be achieved by other means, e.g. etching. Also, the superstrate may be shaped to provide for improved extraction efficiency as shown by Krames et. al. in Appl. Phys. Lett. 75, pp. 2365–2367. One such shape is an inverted pyramid design, such that the top surface of the superstrate has a surface area larger than that of its bottom surface. This embodiment is illustrated in FIG. 15.

The submount can provide functionality and affect performance. Because it is in the thermal path for heat removal from the LED, the submount material should have high thermal conductivity. Suitable materials include Si, AlN, or BeO. The submount should be relatively thin to reduce thermal resistance. For example, a Si submount should be less than 250 µm. Si is attractive as a submount material because of its good thermal conductivity, ~100 W/mK, and capability for integrated electronics. The submount may provide an electrical isolation between the LED and the package. In this case, two connections for the anode and cathode are required on the top surface of the submount to the package leads. Alternatively, if electrical isolation of the package is unnecessary and if the submount is conductive, one electrode can be contacted through the submount to the package. Then only one interconnect is required from the top of the submount to the opposing lead. The top surface metallization of the submount should be wire bondable and also reflective, to redirect downward travelling light upwards with high efficiency. Hence, Ag and Al are suitable choices for the submount top surface metallization.

Figure 16:
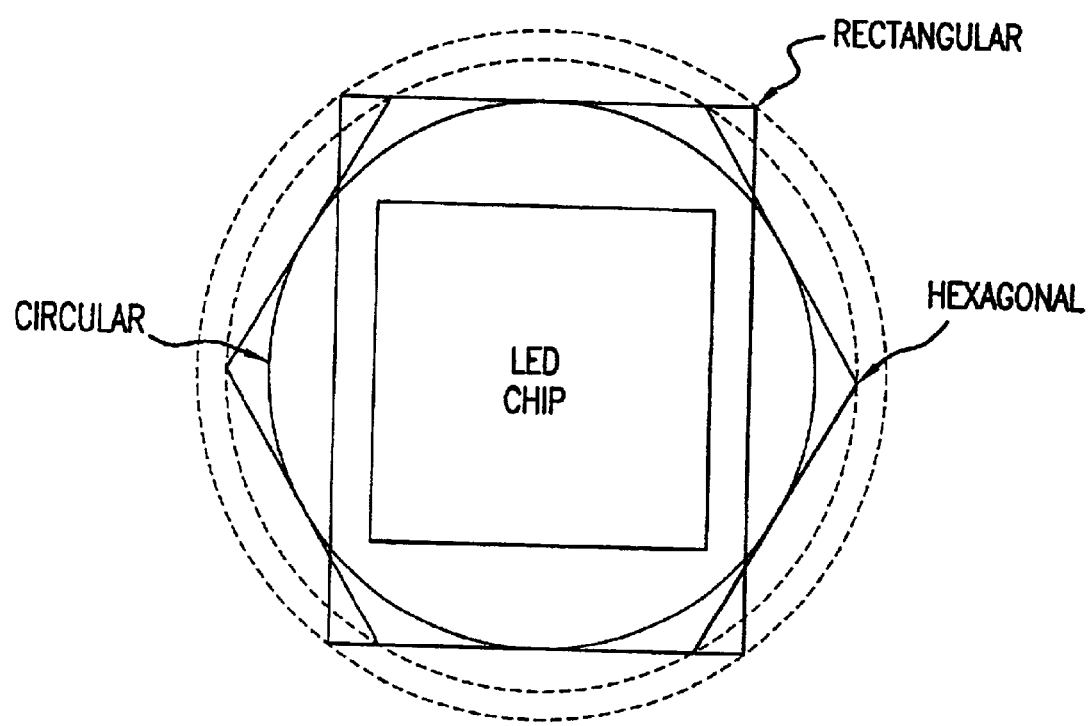
FIG. 16 illustrates alternate embodiments for the submount.

The submount shape, as well as the specularity of the reflective metallization atop the submount, can impact the optics in an LED lighting system by affecting the apparent source size of the LED. Most LEDs require a reflector cup to redirect light emitted predominantly laterally from the die upwards and within the useful radiation pattern. The larger this reflector cup must be, the larger the primary and any secondary lenses must be. Since optics costs are proportional to the volume of material required, it is desirable to minimize the reflector cup radius. The inclusion of a submount effectively increases the size of the LED die, because of the extra space needed for wirebond connections. Typical wirebond tolerances require that 400 µm material extends beyond the LED die for reliable wirebonding. Also, dicing the submount wafer requires ~100 µm of space between neighboring LED die. These tolerances result in a significant effective increase in LED die size. For example, a 1×1 m² LED die would require a 1.8×1.1 mm² area using a rectangular geometry for the submount. The largest extent of this submount is a diagonal equal to $(1.8^2+1.1^2)^{1/2}=2.11$ mm, which puts a lower limit on the diameter for the reflector cup. Instead, if the submount is shaped as a disk, the largest extent of the submount is merely 1.8 mm. Thus, a disk-shaped submount allows for a significant reduction in reflector cup diameter. Because circular cuts can be difficult to manufacture, other geometrical shapes which approximate circular disks are preferable. For example, hexagonal submounts may be fabricated by multiple-pass sawing (three passes instead of two) and are preferable to square or rectangular submounts. These ideas are illustrated in FIG. 16. The reflective metallization on top of the submount should be as specular as possible, so as not to create a virtual source in the plane of the submount which is larger than the LED die. A virtual source size larger than the LED die would have a deleterious effect on the radiation pattern of the LED and require larger optics to correct.

The submount, shown in FIGS. 6b, 9b, and 12b, allows for electronic functionality within the LED. III-nitride devices are susceptible to electro-static discharge (ESD) damage and may be protected by a power shunting element electrically connected to the LED as described in Antle et. al. U.S. Pat. No. 5,941,501. For the present invention, a Si submount may be embedded with circuitry for integrated ESD protection. In this case the protection circuits, e.g. a Zener diodes, are connected in parallel with the LED die. Alternatively, back-to-back Zener diodes may be fabricated in parallel with the LED die to allow the LED to be driven by alternating-current power supplies. Other electronic devices may be included within the submount, e.g. photo-detectors for monitoring light output or resistors for monitoring current and/or voltage. These devices will allow an integrated system to provide closed-loop feedback control for maintaining constant light-output operation.

Figure 17A:
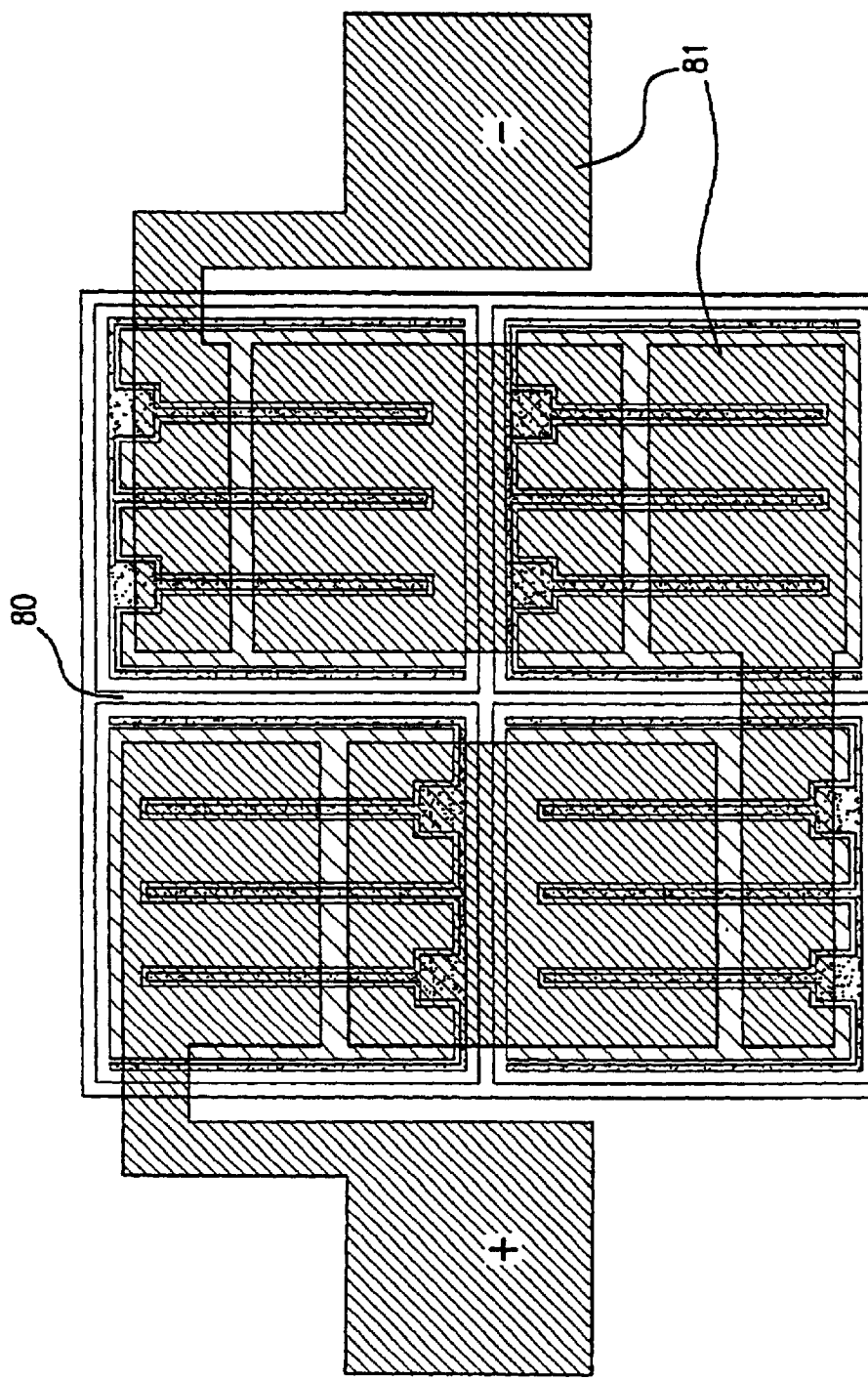
FIGS. 17a–b illustrates multiple series-interconnected light emitting structures according to the present invention.
Figure 17B:
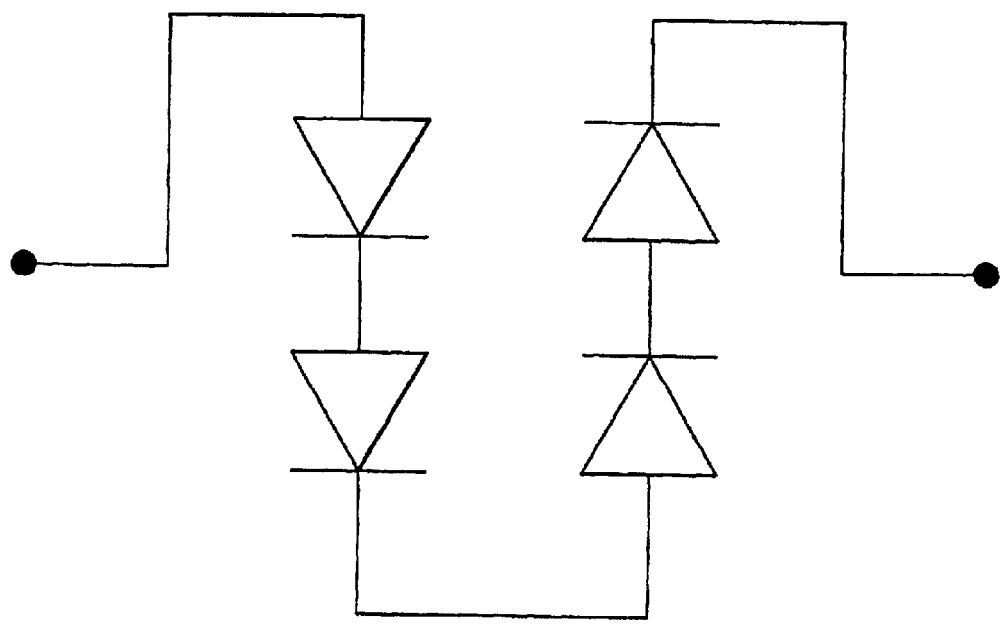
Figure 18:
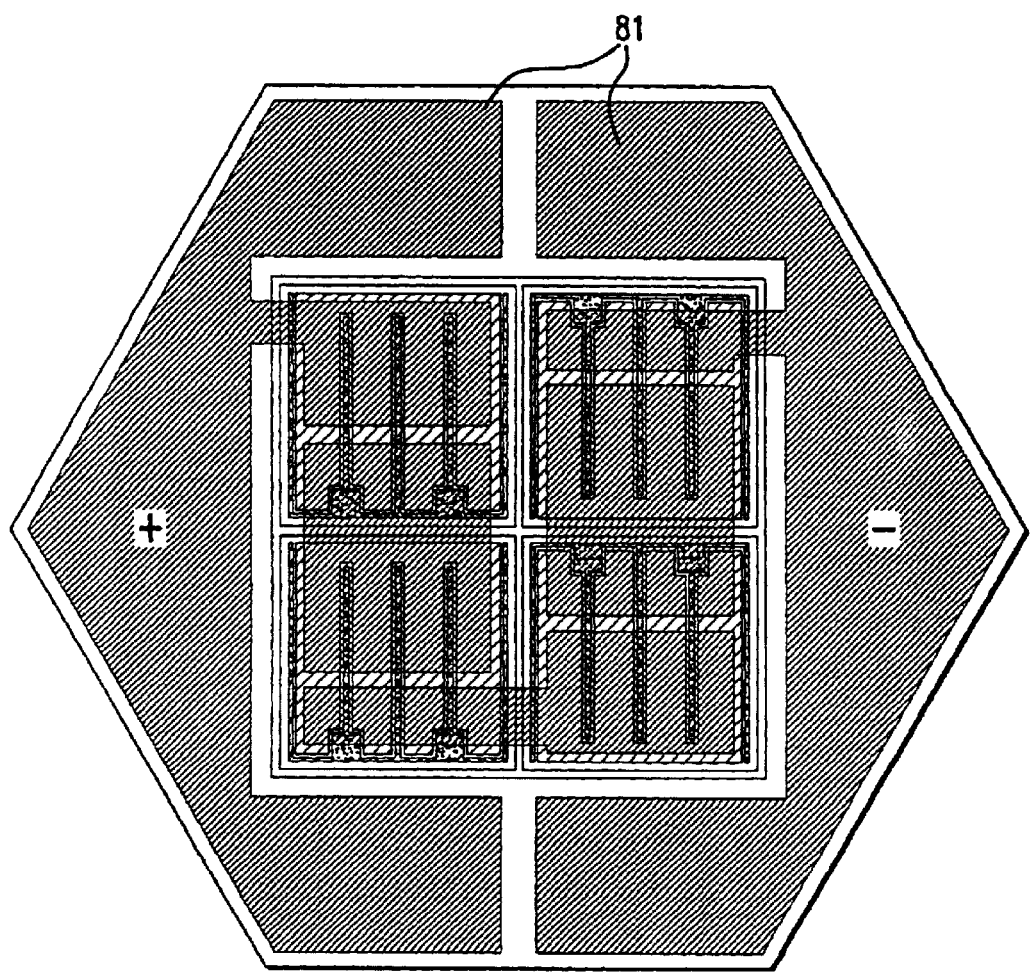
FIG. 18 illustrates multiple series-interconnected light emitting structures connected to a submount.

A submount provides for an LED based on multiple series-interconnected light-emitting diodes in a monolithic structure as shown in FIG. 17a. The assembly has four serially connected LEDs that are electrically isolated via etching to remove III-nitride material to form a trench 80 between them. The etching proceeds to at least the undoped III-nitride layers. The electrical interconnections are provided by metallic traces 81 laid out on the submount (not shown). The solder metallization is designed so that the diodes are electrically connected to the submount metallic traces via the solder. The resulting device may be represented by the electronic circuit shown in FIG. 17b. This device thus operates at 4× the voltage, and 4× less current, than a conventional LED of the same active junction area. For example, a 1 $mm^2$ conventional III-nitride LED may operate at 3.0 V and 350 mA. This same active junction area, broken up into four series-interconnected LEDs as shown in FIG. 17a, provides a device operating at 12.0 V and 87.5 mA. This higher voltage, lower current operation places less demand on the electronic driver circuit for the LED. In fact, the electronic driver circuit can run at higher efficiency at higher voltages, improving the overall efficiency of the LED lighting system. This embodiment, a monolithic device, is preferred over a conventional approach of attaching individual LED die in series. In the conventional approach, the total area taken up by the LED die is increased because of the tolerances required by die-attach machines. This undesirably increases the optical source size of the total LED and requires an increase in subsequent optics sizes in the LED system. In the preferred embodiment, the diodes may be spaced as close together as allowed by the trench etching for electrical isolation. The trench width may be as small as a few microns, so that the packing density of diodes in the embodiment can be very high. As shown in FIG. 18, the four 1 mm LED die are monolithically fabricated and share a single superstrate and submount. The metal traces 81 on the submount electrically connect the four LEDs in series. While each 1 $mm^2$ LED normally operates at 3V, the four serially-connected LED module in FIG. 18 operates at 12V. The submount design is hexagonal to reduce the effective optical source size of the module. The trace metallization 81 is used for wirebonding for external connection and consists of a reflective metallization, e.g. Ag or Al.

Light extraction efficiency may be further improved by placing the active region layers near the highly reflective p-electrode. When the center of the active region is brought within approximately an odd multiple of quarter-wavelengths of light within the material (~λ/4n) from the reflective p-electrode, constructive interference of the downward and upward travelling light results in a radiation pattern that emits power preferentially in the upward direction. This enhancement is in a direction close to normal to the III-nitride/substrate and is not susceptible to total internal reflection back into the III-nitride epi layers. Alternatively, slight detuning of the resonance condition, by moving the active region slightly closer to (or farther from) the p-electrode reflector, may be preferred to optimize the light extraction improvement for total flux in all directions. For maximum efficiency in most applications, the distance between the active region and the p-electrode should be approximately one quarter-wavelength.

Figure 19:
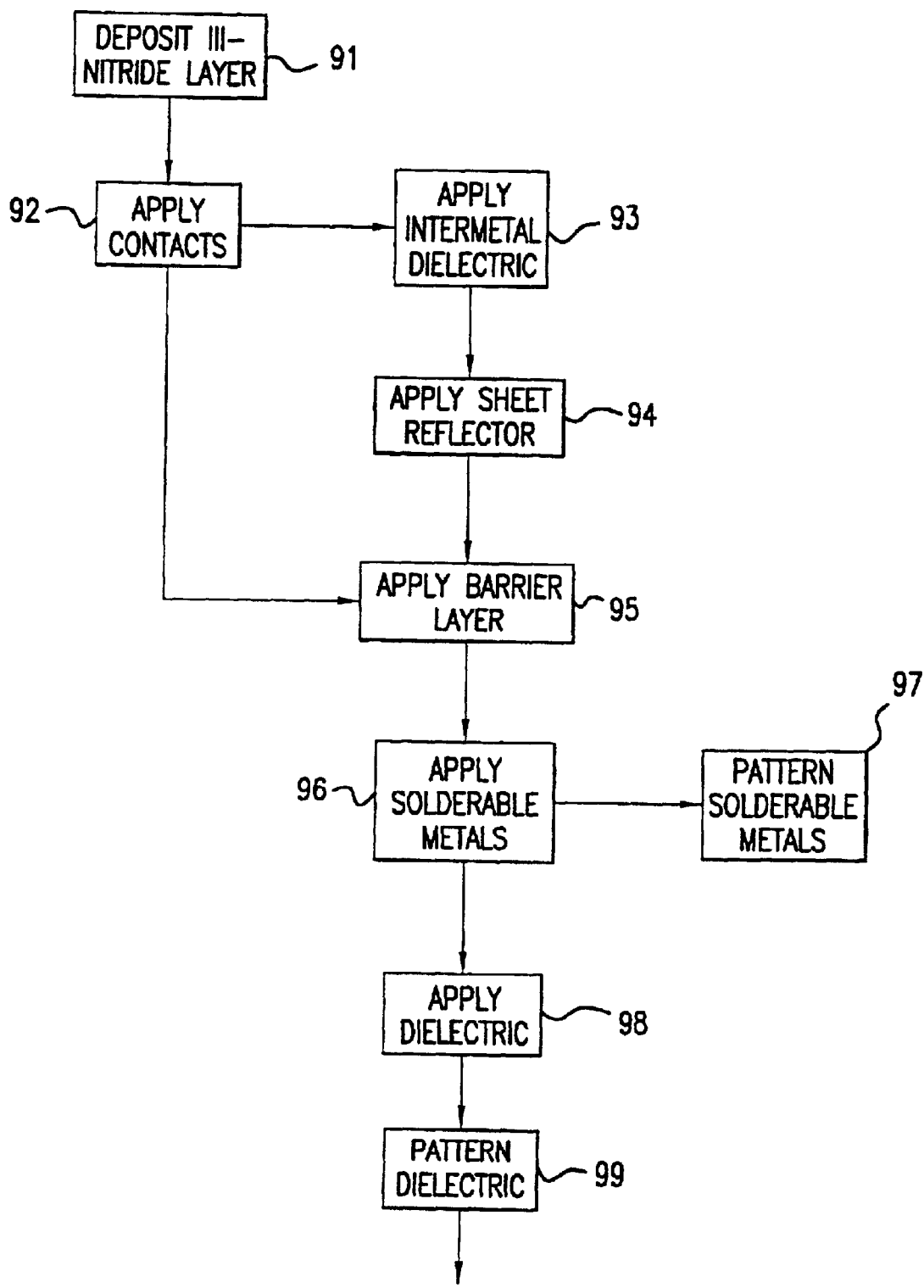
FIG. 19 illustrates a flowchart for manufacturing the III-nitride LED.

FIG. 19 illustrates a process flowchart for fabricating the LED die. In step 91, a III-nitride heterostructure is deposited on a growth substrate. In step 92, contacts are applied to the III-nitride heterostructure, etching if necessary. The p-contact is opaque and electrically connected to the p-type layer while the n-contact is electrically connected to the n-type layer. In optional steps 93 and 94, an intermetal dielectric is applied over at least the n-contact in regions where the n-contact interposes the p-contact and a sheet reflector is applied respectively. In step 95, an optional barrier layer is applied to protect the contacts and reflector from solder. In step 96, solderable metals are applied. In optional step 97, the solderable metals are patterned. In step 98, dielectric is applied to define the solderable areas. In step 99, the dielectric is patterned. The LED die may be attached to the submount after step 97 or step 99.

Figure 20:
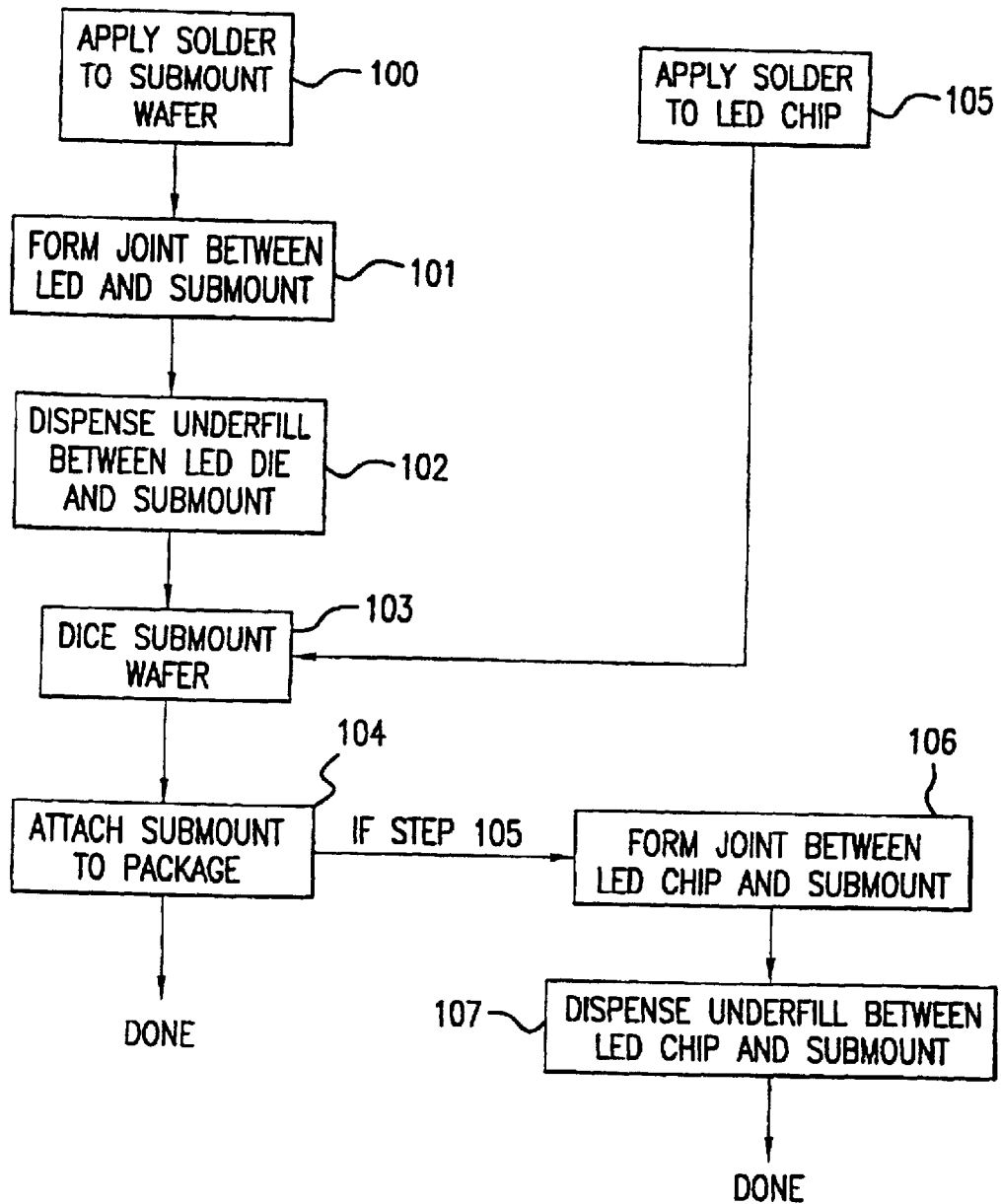
FIG. 20 illustrates a flowchart for attaching the III-nitride LED to a submount.

FIG. 20 illustrates a process flowchart for attaching the LED to the submount. In step 100, solder is applied to the submount wafer. In step 101, a joint is formed between the LED die and the submount. In optional step 102, underfill is dispensed between the LED die and the submount. In step 103, the submount wafer is separated. In step 104, the die and submount are attached to the package.

Alternatively, step 105 is completed in lieu of steps 100, 101, and 102. In step 105, solder is applied to the LED. In step 106, a joint is formed between the LED die and the submount wafer. In optional step 107, underfill is dispensed between the LED die and submount.

We claim:

1. A light-emitting device comprising:
   a heterostructure of III-nitride materials comprising an active region having a peak emission wavelength, an n-layer, and a p-layer;
   a p- and an n-electrode, the p-electrode being attached to the p-layer, the n-electrode being attached to the n-layer, wherein the p-electrode and n-electrode are attached to a same side of the light emitting device; and
   a superstrate, having a refractive index greater than a refractive index of sapphire, attached to the heterostructure.

2. A light-emitting device, as defined in claim 1, wherein the superstrate has an absorption coefficient less than 3 $cm^{-1}$ at the peak emission wavelength.

3. A light-emitting device, as defined in claim 1, wherein the p-electrode has an absorption less than 25%.

4. A light-emitting device, as defined in claim 1, wherein at least one of the layers comprising the heterostructure is textured.

5. A light-emitting device, as defined in claim 1, wherein the superstrate is selected from a group that includes SiC, ZnO, YAG, ZnSe, ZnS, zirconia, diamond, and CdS.

6. A light-emitting device, as defined in claim 5, wherein the superstrate is SiC and has a resistivity greater than 0.5 $\Omega$cm.

7. A light-emitting device, as defined in claim 1, wherein at least one surface of the superstrate is roughened.

8. A light-emitting device, as defined in claim 1, wherein a top surface area of the superstrate is larger than a bottom surface area of the superstrate.

9. A light-emitting device, as defined in claim 1, wherein a portion of the p-electrode interposes portions of the n-electrode.

10. A light-emitting device, as defined in claim 1, wherein the p-electrode comprises Au/NiO$_x$/Al.

11. A light-emitting device, as defined in claim 1, wherein light is extracted from the active region through the superstrate.

12. A light-emitting device, as defined in claim 1, further comprising:
    a submount;
    an n-interconnect connecting the n-electrode to the submount; and
    a p-interconnect connecting the p-electrode to the submount.

13. A light-emitting device, as defined in claim 12, wherein the n-interconnect and p-interconnect are selected from the group consisting of molder, elemental metals, metal alloys, semiconductor-metal alloys, thermally and electrically conductive pastes, thermally and electrically conductive compounds, epoxies, eutectic joints, Au stud-bumps, and solder bumps.

14. A light-emitting device, as defined in claim 12, further comprising:
    a p-conductive interface disposed between the p-interconnect and the p-electrode; and
    an n-conductive interface disposed between the n-interconnect and the n-electrode.

15. A light-emitting device, as defined in claim 14, wherein the p-conductive interface and the n-conductive interface comprise wettable metals.

16. A light-emitting device, as defined in claim 14, wherein the lateral cross sectional area of the n-conductive interface and the p-conductive interface is at least 15% of an area of the p-electrode.

17. A light-emitting device, as defined in claim 14, further comprising a barrier layer disposed between the p-electrode and the p-conductive interface.

18. A light-emitting device, as defined in claim 17, wherein the barrier layer is selected from the group consisting of Ni, Cr, Cu, and Ti.

19. A light-emitting device, as defined in claim 12, wherein the submount comprises a material selected from the group consisting of Si, AlN, and BeO.

20. A light-emitting device, as defined in claim 12, wherein the submount has a thickness less than 250 $\mu$m.

21. A light-emitting device, as defined in claim 1, wherein the superstrate is SiC.

22. A light-emitting device, as defined in claim 1, wherein the superstrate has an index of refraction greater than an index of refraction of at least one of the n-layer and the p-layer.

23. A light-emitting device, as defined in claim 1, wherein at least one surface of the superstrate is textured.

24. A light-emitting device, an defined in claim 23, wherein the texturing is random.

25. A light-emitting device, as defined in claim 23, wherein the texturing is ordered.

26. A light-emitting device, as defined in claim 1, wherein the superstrate comprises a light-randomizing surface.

27. A light-emitting device, as defined in claim 26, wherein the light-randomizing surface is formed by sawing.

28. A light-emitting device, as defined in claim 26, wherein the light-randomizing surface is farmed by etching.

29. A light-emitting device, as defined in claim 1, wherein the superstrate is shaped.

30. A light-emitting device, as defined in claim 29, wherein the shape of the superstrate is selected to increase extraction of light from the superstrate.

31. A light-emitting device, as defined in claim 1, wherein the superstrate comprises:
    a first surface; and
    a second surface substantially parallel to the first surface; wherein an area of the first surface is smaller than an area of the second surface.

32. A light-emitting device, as defined in claim 31, wherein the superstrate further comprises a third surface angled with respect to the first surface and the second surface, wherein the third surface connects an edge of the first surface to an edge of the second surface.

33. A light-emitting device, as defined in claim 31, wherein the first surface is adjacent to the heterostructure.

34. A light-emitting device, as defined in claim 1, wherein the superstrate comprises:
    a first surface in contact with the heterostructure; and
    a second surface angled with respect to the first surface.

35. A light-emitting device, as defined in claim 34, wherein an angle between the second surface and the first surface is obtuse.

36. A light-emitting device, as defined in claim 34, wherein the second surface is non-normal to the first surface.

* * * * *